US012672293B2

(12) United States Patent
Chavan et al.

(10) Patent No.: US 12,672,293 B2
(45) Date of Patent: Jun. 30, 2026

(54) MEMORY DEVICE ASSEMBLY WITH A LEAKER DEVICE

(71) Applicant: Micron Technology, Inc., Boise, ID (US)

(72) Inventors: Ashonita A. Chavan, Boise, ID (US); Aysha Siddique Shanta, Boise, ID (US); Aditi P. Kulkarni, Broomfield, CO (US)

(73) Assignee: Micron Technology, Inc., Boise, ID (US)

( * ) Notice: Subject to any disclaimer, the term of this patent is extended or adjusted under 35 U.S.C. 154(b) by 809 days.

(21) Appl. No.: 17/818,219

(22) Filed: Aug. 8, 2022

(65) Prior Publication Data

US 2024/0049473 A1 Feb. 8, 2024

(51) Int. Cl.
H10B 53/30 (2023.01)
G11C 11/22 (2006.01)
H10B 12/00 (2023.01)
H10D 1/68 (2025.01)

(52) U.S. Cl.
CPC ............ H10B 53/30 (2023.02); G11C 11/221 (2013.01); H10B 12/03 (2023.02); H10D 1/711 (2025.01); H10D 1/716 (2025.01)

(58) Field of Classification Search
CPC ........ H10B 53/30; G11C 11/221; H10D 1/711
See application file for complete search history.

(56) References Cited

U.S. PATENT DOCUMENTS

| | | | |
|---|---|---|---|
| 6,342,734 B1 * | 1/2002 | Allman | ................... H10D 1/68 |
| | | | 257/296 |
| 2019/0304897 A1 * | 10/2019 | Lajoie | ................ H10B 12/0335 |
| 2021/0210491 A1 * | 7/2021 | Servalli | ................ H10B 12/485 |
| 2021/0328049 A1 * | 10/2021 | Clark | ..................... H10D 62/80 |

* cited by examiner

*Primary Examiner* — Amar Movva
(74) *Attorney, Agent, or Firm* — Harrity & Harrity, LLP

(57) ABSTRACT

Implementations described herein relate to various structures, integrated assemblies, and memory devices. In some implementations, an integrated assembly includes a cell plate, a pillar that includes a bottom electrode and a leaker device on top of the bottom electrode, and a top electrode. The top electrode includes a first top electrode portion and a second top electrode portion. The first top electrode portion is separated from the bottom electrode by the leaker device. The second top electrode portion is separated from the bottom electrode and the leaker device by an insulator. The leaker device is configured to discharge excess charge from the bottom electrode to the cell plate via the first top electrode portion.

25 Claims, 40 Drawing Sheets

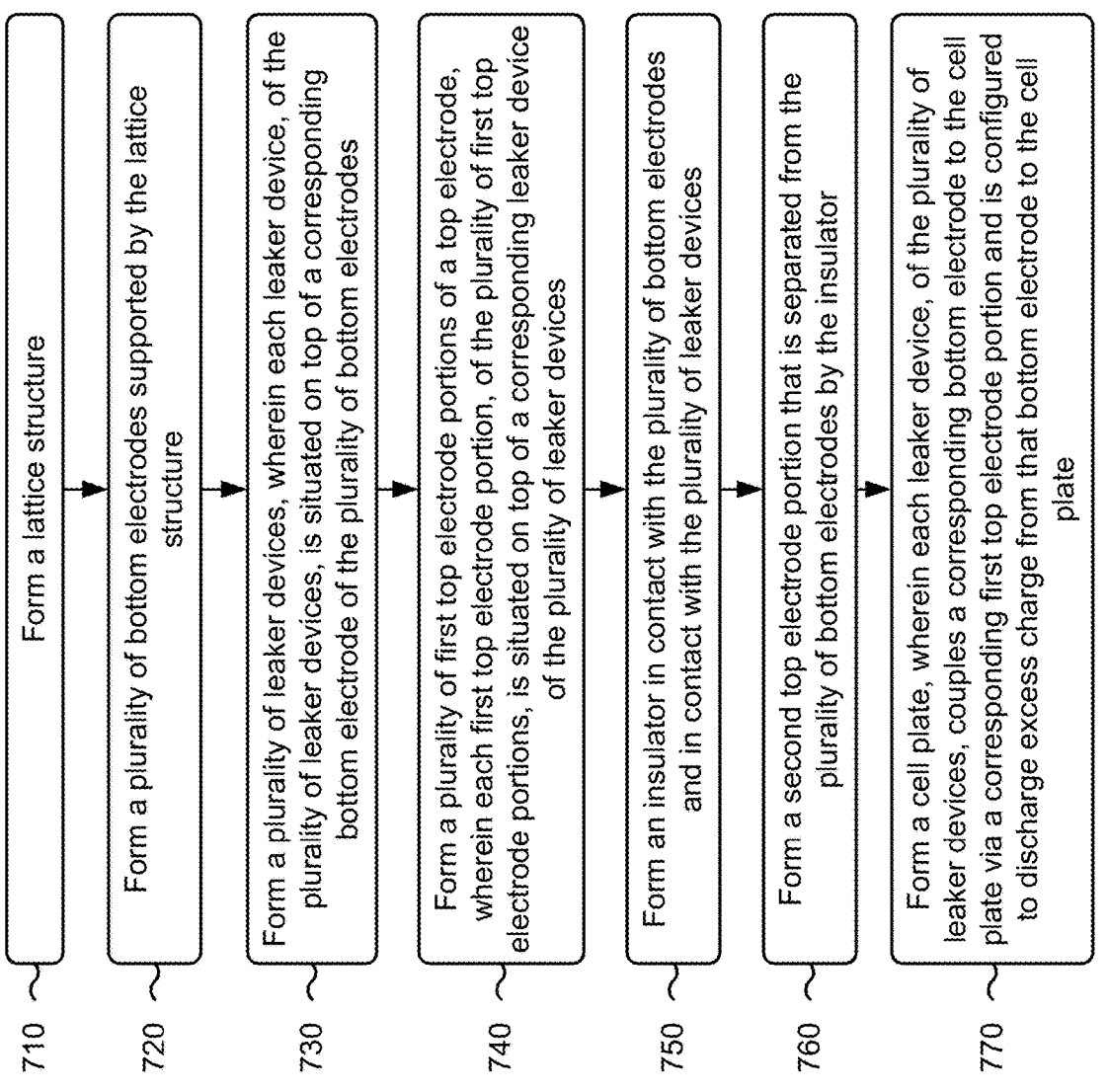

710   Form a lattice structure

720   Form a plurality of bottom electrodes supported by the lattice structure

730   Form a plurality of leaker devices, wherein each leaker device, of the plurality of leaker devices, is situated on top of a corresponding bottom electrode of the plurality of bottom electrodes 740   Form a plurality of first top electrode portions of a top electrode, wherein each first top electrode portion, of the plurality of first top electrode portions, is situated on top of a corresponding leaker device of the plurality of leaker devices 750   Form an insulator in contact with the plurality of bottom electrodes and in contact with the plurality of leaker devices 760   Form a second top electrode portion that is separated from the plurality of bottom electrodes by the insulator 770   Form a cell plate, wherein each leaker device, of the plurality of leaker devices, couples a corresponding bottom electrode to the cell plate via a corresponding first top electrode portion and is configured to discharge excess charge from that bottom electrode to the cell plate

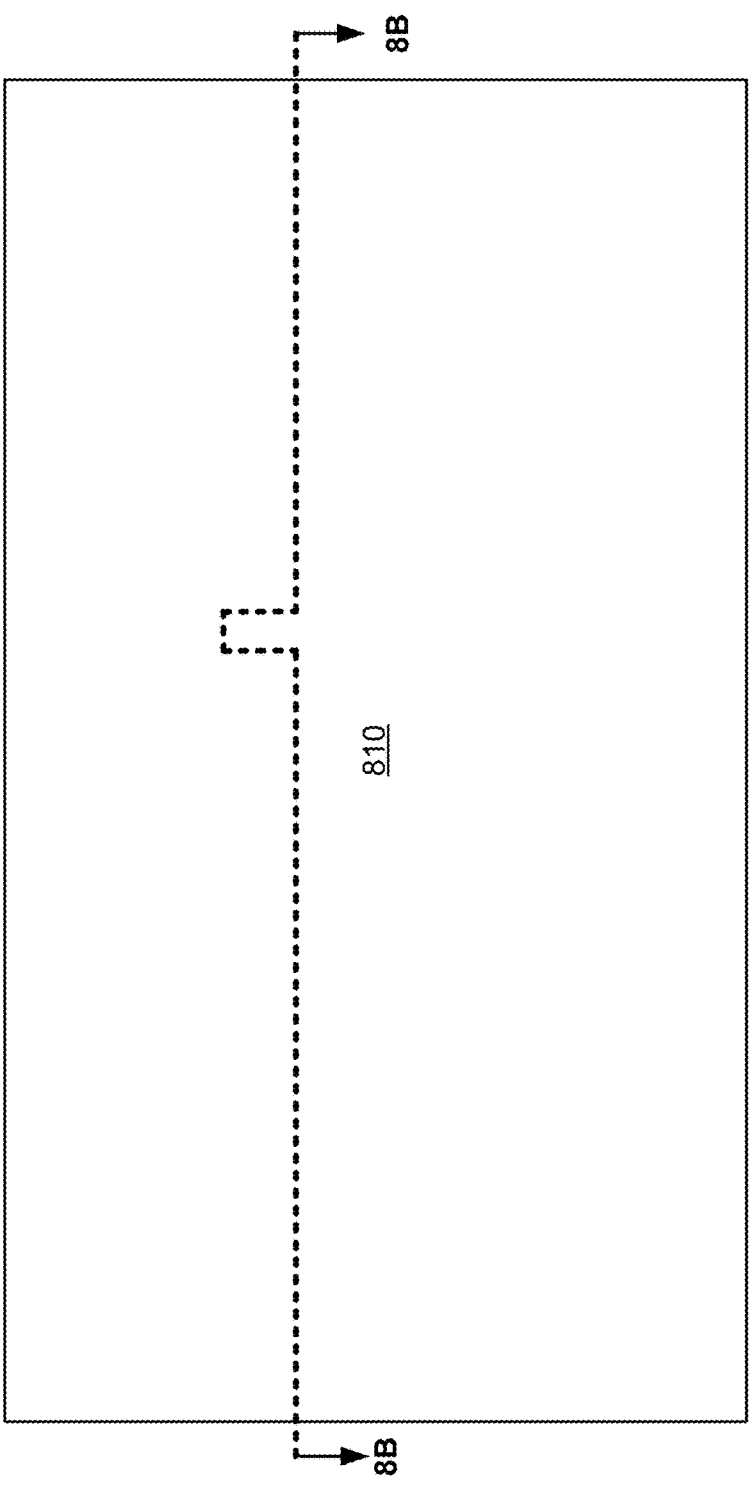
810
8B
8B
FIG. 8A

810

808

806

802 804 802 804 802 804 802 804 802 804 802 804 802 804 802 804 802 804 802

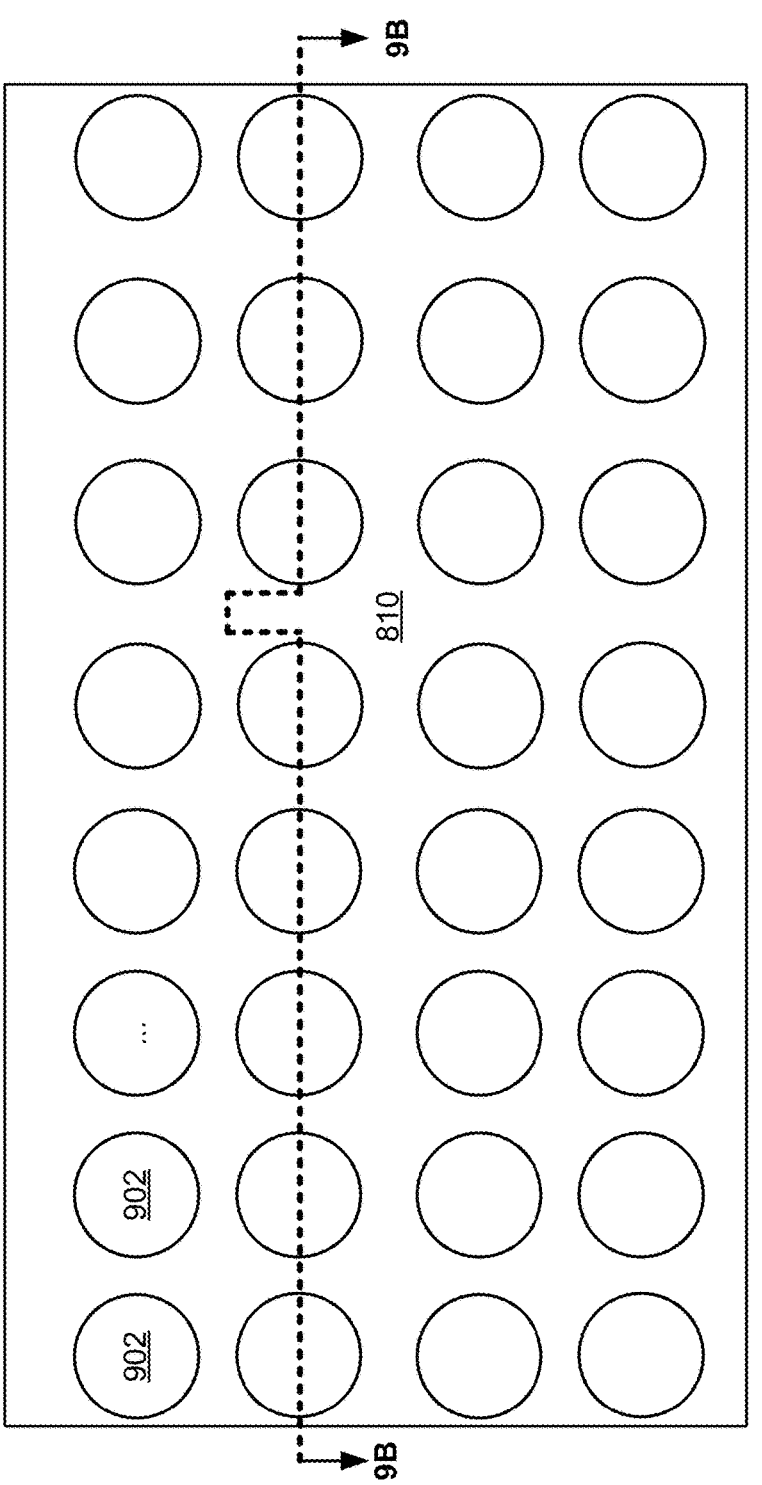
FIG. 9A

810

808

806

804

810

808

806

804

810

808

806

804

810

808

806

804

810

808

806    802

804

810

808

806

804

810

808

806

804

902

810

808

806

804

902

810

808

806

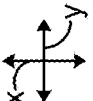
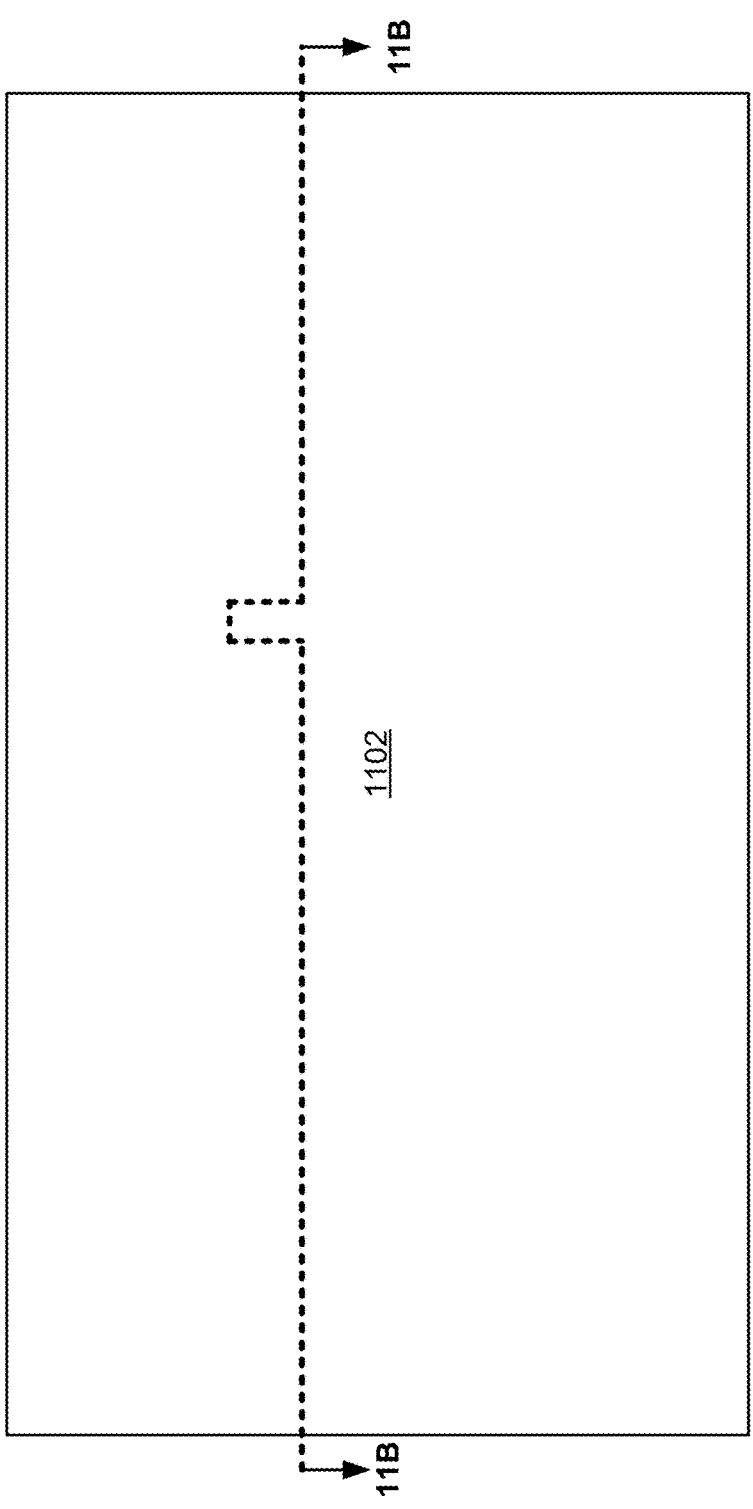
FIG. 11A

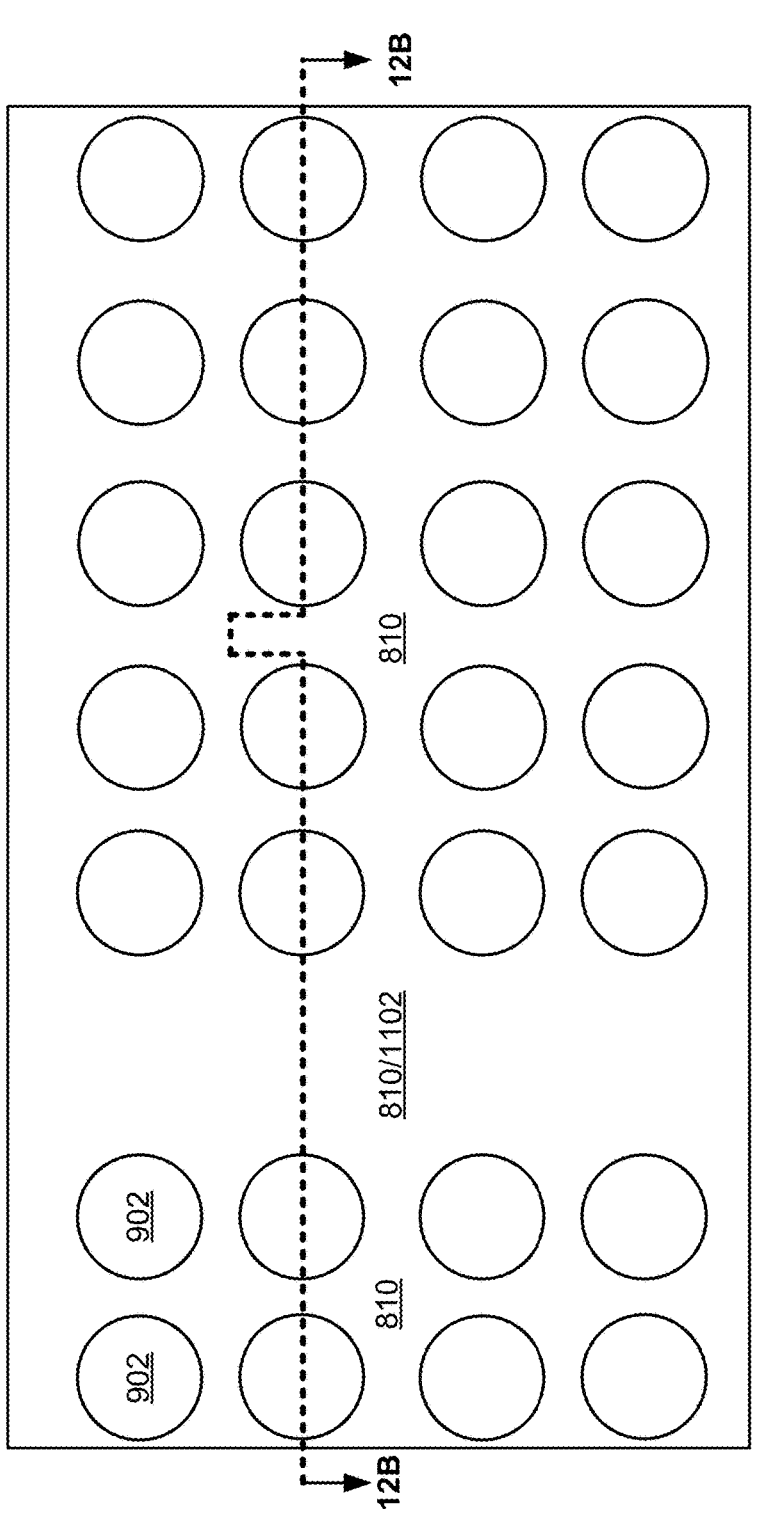
FIG. 12A

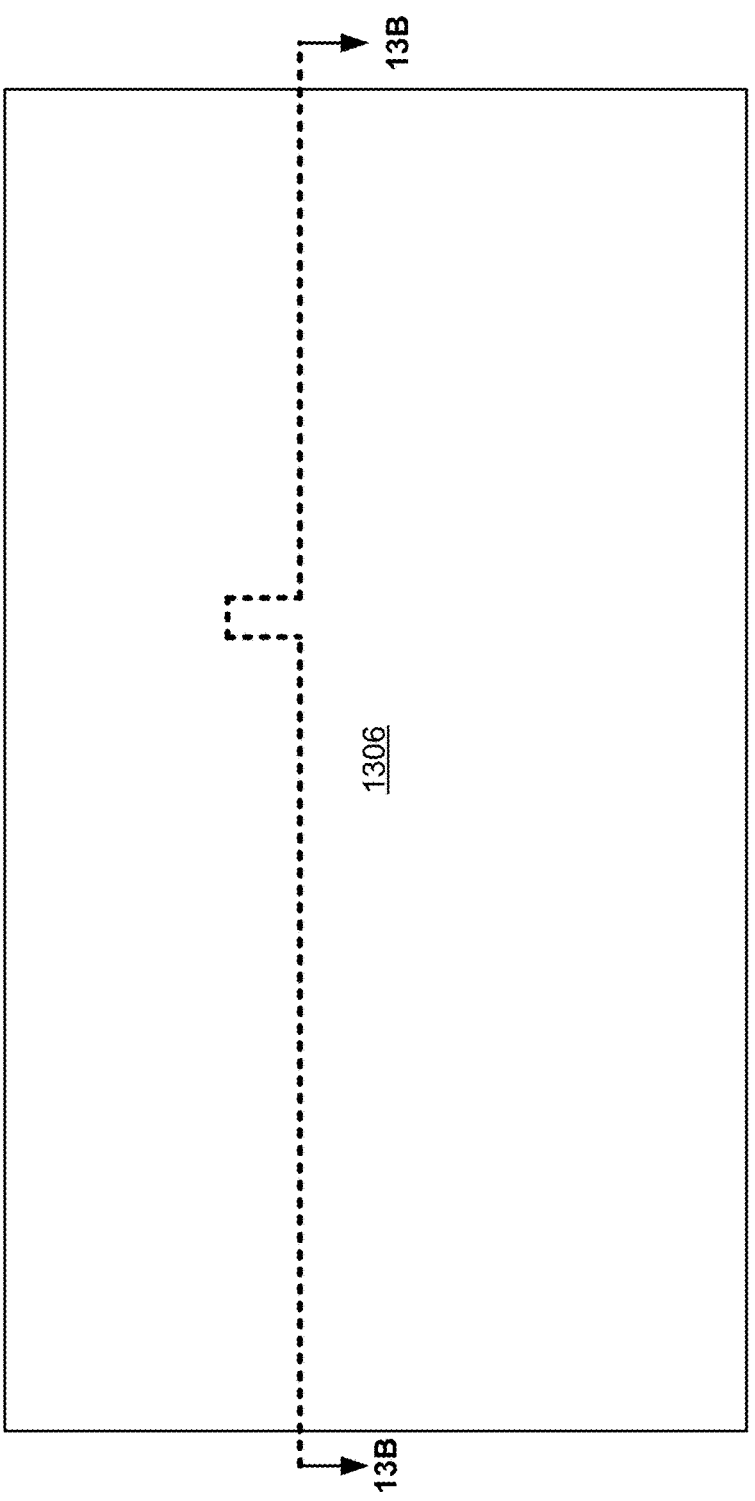
13B
1306
13B
FIG. 13A

810

808

806

804

810

808

806

804

810

808

806

804

810

808

806

804

810

808

806

1502

804

810

808

806

1502

804

810

808

806

1004

1102

804

810

808

806

804

1402

810

808

806

804

1402

810

808

806

804

1302

1306

802

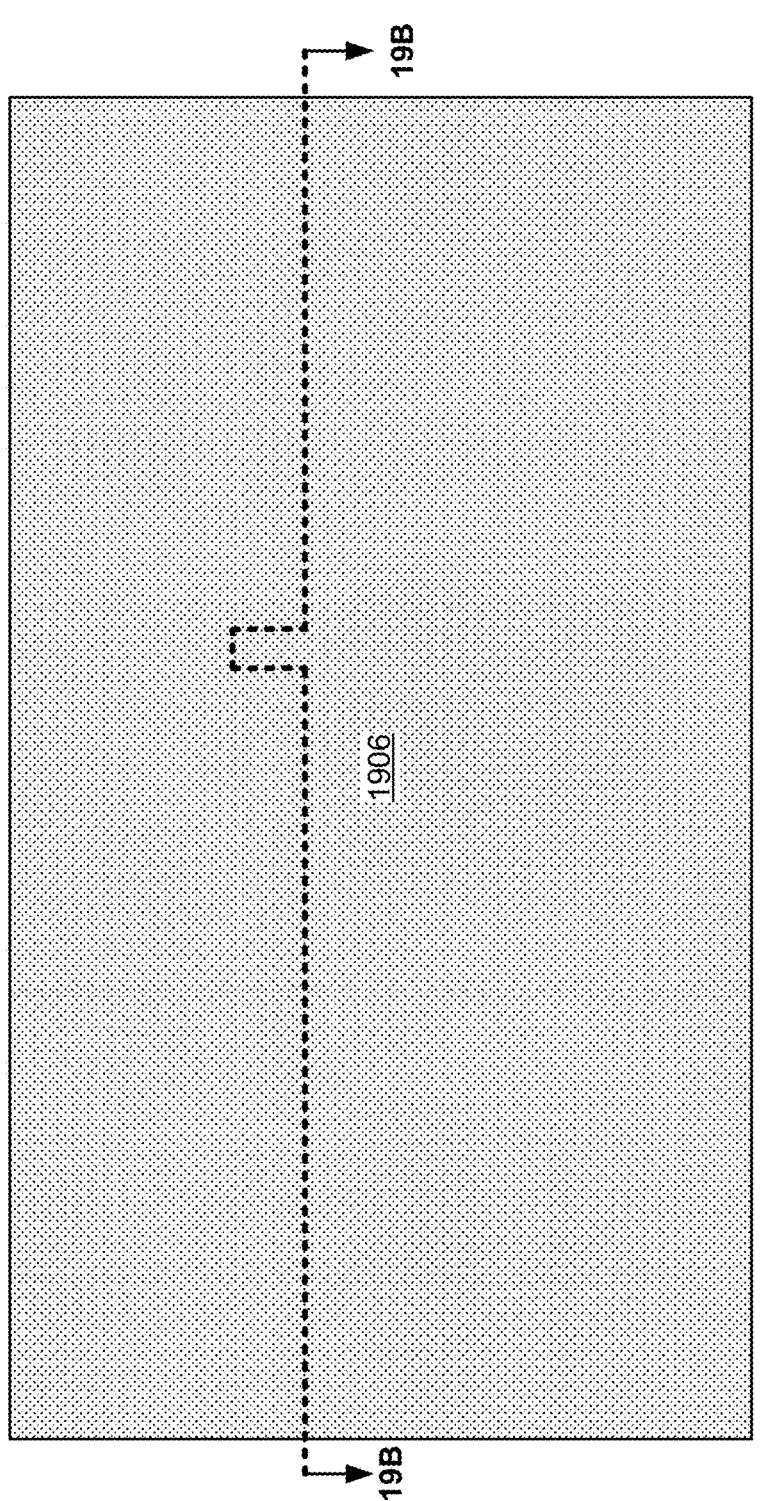
1906
19B
19B
FIG. 19A

21B

2102

2104

1102

2102

21B

MEMORY DEVICE ASSEMBLY WITH A LEAKER DEVICE

TECHNICAL FIELD

The present disclosure generally relates to semiconductor devices and methods of forming semiconductor devices. For example, the present disclosure relates to a memory device assembly with a leaker device.

BACKGROUND

Memory devices are widely used to store information in various electronic devices. A memory device includes memory cells. A memory cell is an electronic circuit capable of being programmed to a data state of two or more data states. For example, a memory cell may be programmed to a data state that represents a single binary value, often denoted by a binary "1" or a binary "0." As another example, a memory cell may be programmed to a data state that represents a fractional value (e.g., 0.5, 1.5, or the like). To store information, the electronic device may write, or program, a set of memory cells. To access the stored information, the electronic device may read, or sense, the stored state from the set of memory cells.

Various types of memory devices exist, including random access memory (RAM), read only memory (ROM), dynamic RAM (DRAM), static RAM (SRAM), synchronous dynamic RAM (SDRAM), ferroelectric RAM (FeRAM), magnetic RAM (MRAM), resistive RAM (RRAM), flash memory (e.g., NAND memory and NOR memory), and others. A memory device may be volatile or non-volatile. Non-volatile memory (e.g., flash memory) can store data for extended periods of time even in the absence of an external power source. Volatile memory (e.g., DRAM) may lose stored data over time unless the volatile memory is refreshed by a power source. A binary memory device may, for example, include a charged or discharged capacitor. A charged capacitor may, however, become discharged over time through leakage currents, resulting in the loss of the stored information. Some features of volatile memory may offer advantages, such as faster read or write speeds, while some features of non-volatile memory, such as the ability to store data without periodic refreshing, may be advantageous.

FeRAM may use similar device architectures as volatile memory but may have non-volatile properties due to the use of a ferroelectric capacitor as a storage device. For example, FeRAM has advantages of faster write speeds and endurance for repeated memory access with lower power consumption than other types of non-volatile memory. FeRAM can provide non-volatile functionality comparable to that of flash memory with a speed and architecture comparable to that of DRAM. Thus, FeRAM devices may have improved performance compared to other types of non-volatile memory and/or volatile memory.

BRIEF DESCRIPTION OF THE DRAWINGS

FIG. 5A is a top cross-sectional view along the line 5A-5A of FIGS. 5B and 5C, FIG. 5B is a side cross-sectional view along the line 5B-5B of FIG. 5A, and FIG. 5C is a side cross-sectional view along the line 5C-5C of FIG. 5A.

FIG. 6A is a top cross-sectional view along the line 6A-6A of FIGS. 6B and 6C, FIG. 6B is a side cross-sectional view along the line 6B-6B of FIG. 6A, and FIG. 6C is a side cross-sectional view along the line 6C-6C of FIG. 6A.

FIG. 7 is a flowchart of an example method of forming an integrated assembly or memory device with a leaker device.

FIGS. 8A and 8B are diagrammatic views showing formation of the structure of FIGS. 5A-5C at an example process stage of an example process of forming the structure. FIG. 8A is a top view, and FIG. 8B is a cross-sectional view along the line 8B-8B of FIG. 8A.

FIGS. 9A and 9B are diagrammatic views showing formation of the structure of FIGS. 5A-5C at an example process stage that is after the example process stage of FIGS. 8A and 8B. FIG. 9A is a top view, and FIG. 9B is a cross-sectional view along the line 9B-9B of FIG. 9A.

FIG. 10A is a top view, and FIG. 10B is a cross-sectional view along the line 10B-10B of FIG. 10A.

FIGS. 11A and 11B are diagrammatic views showing formation of the structure of FIGS. 5A-5C at an example process stage that is after the example process stage of FIGS. 10A and 10B. FIG. 11A is a top view, and FIG. 11B is a cross-sectional view along the line 11B-11B of FIG. 11A.

FIGS. 12A and 12B are diagrammatic views showing formation of the structure of FIGS. 5A-5C at an example process stage that is after the example process stage of FIGS. 11A and 11B. FIG. 12A is a top view, and FIG. 12B is a cross-sectional view along the line 12B-12B of FIG. 12A.

FIGS. 13A and 13B are diagrammatic views showing formation of the structure of FIGS. 5A-5C at an example process stage that is after the example process stage of FIGS. 12A and 12B. FIG. 13A is a top view, and FIG. 13B is a cross-sectional view along the line 13B-13B of FIG. 13A.

FIG. 14A is a top view, and FIG. 14B is a cross-sectional view along the line 14B-14B of FIG. 14A.

FIG. 15A is a top view, and FIG. 15B is a cross-sectional view along the line 15B-15B of FIG. 15A.

FIG. 16A is a top view, and FIG. 16B is a cross-sectional view along the line 16B-16B of FIG. 16A.

FIG. 17A is a top view, and FIG. 17B is a cross-sectional view along the line 17B-17B of FIG. 17A.

FIGS. 18A and 18B are diagrammatic views showing formation of the structure of FIGS. 5A-5C at an example process stage that is after the example process stage of FIGS. 17A and 17B. FIG. 18A is a top view, and FIG. 18B is a cross-sectional view along the line 18B-18B of FIG. 18A.

FIGS. 19A and 19B are diagrammatic views showing formation of the structure of FIGS. 5A-5C at an example process stage that is after the example process stage of FIGS. 18A and 18B. FIG. 19A is a top view, and FIG. 19B is a cross-sectional view along the line 19B-19B of FIG. 19A.

FIG. 20A is a top view, and FIG. 20B is a cross-sectional view along the line 20B-20B of FIG. 20A.

FIG. 21A is a top view, and FIG. 21B is a cross-sectional view along the line 21B-21B of FIG. 21A.

DETAILED DESCRIPTION

Read disturb errors in memory cells can occur due to the accumulation of excess charge within a memory cell. For example, excess charge may accumulate at a bottom electrode of a capacitor included in the memory cell. Such accumulation may occur in FeRAM or other types of memory devices as a result of, for example, plate glitch, access transistor leakage, interactions among memory cells, and/or other factors.

Some implementations described herein use leaker devices to dissipate excess charge that has accumulated at bottom electrodes of capacitors in memory cells. Furthermore, some implementations described herein enable leaker devices to be formed with reduced variation in electrical properties across different leaker devices, which enables more robust and reliable memory device operation. Additionally, some implementations described herein may reduce process variation during memory device fabrication and/or may increase manufacturing yield.

Figure 1:
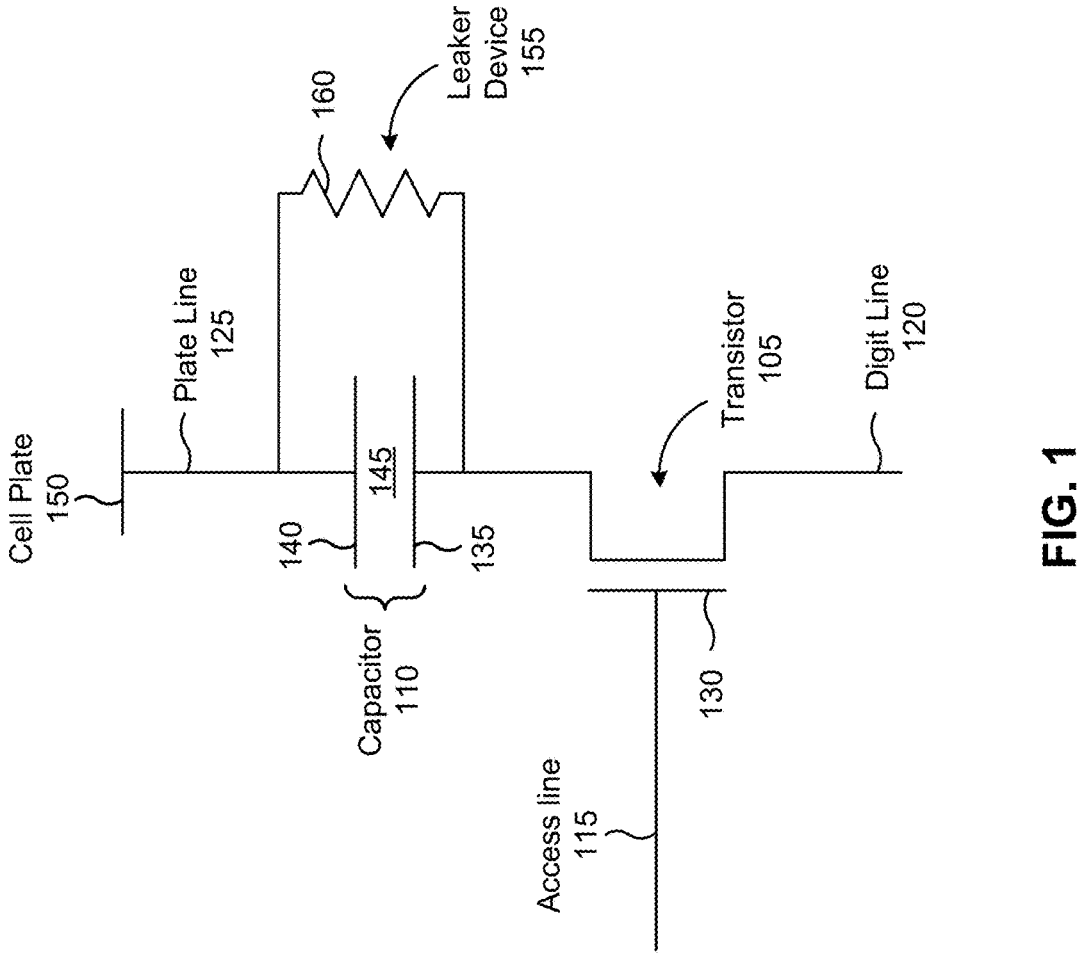
FIG. 1 is a circuit diagram of an example memory cell.

FIG. 1 is a circuit diagram of an example memory cell 100. In some implementations, the memory cell 100 is a ferroelectric memory cell. As shown in FIG. 1, the memory cell 100 may include a transistor 105 (or another type of selection circuit) and a capacitor 110. The memory cell 100 may be accessed (e.g., written to, read from, and/or erased) using signals on a combination of lines that are coupled to the memory cell 100, shown as an access line 115 (sometimes called a "word line"), a digit line 120 (sometimes called a "bit line"), and a plate line 125.

The transistor 105 (sometimes called an access transistor) may include a gate 130. The capacitor 110 includes a bottom electrode 135 and a top electrode 140 separated by an insulator 145. In some implementations, the capacitor is a ferroelectric capacitor, and the insulator 145 is a ferroelectric insulator that comprises, consists of, or consists essentially of ferroelectric material. When the access line 115 is activated (e.g., when a voltage is applied to the access line 115), the gate 130 coupled to the access line 115 may be activated. When the gate 130 is activated, the transistor 105 couples the digit line 120 to the bottom electrode 135 of the capacitor 110. A state of the memory cell 100 may then be written or read via the digit line 120.

The top electrode 140 of the capacitor 110 may be coupled to the plate line 125 and a cell plate 150. To write to (or program) the memory cell 100, the access line 115 may be activated, and a voltage may be applied across the capacitor 110 by controlling the voltage of the top electrode 140 (via the plate line 125 and/or the cell plate 150) and/or the bottom electrode 135 (via the digit line 120). The applied voltage creates an electric field, and the atoms in the ferroelectric material of the insulator 145 respond to the electric field to become arranged in a particular state (e.g., a particular orientation or polarization), which is representative of a data state (e.g., a logic "0" state or a logic "1" state). In some implementations, data may be stored using the capacitor 110 by controlling a voltage difference and/or a polarity difference of the capacitor 110 (e.g., of the insulator 145 between the bottom electrode 135 and the top electrode 140). For example, a voltage of the cell plate 150 and the digit line 120 may be controlled. In some implementations, a negative polarity of the insulator 145 as compared to the cell plate 150 results in a logic "0" state being stored in the capacitor 110, and a positive polarity of the insulator 145 as compared to the cell plate 150 results in a logic "1" state being stored in the capacitor 110.

To read the memory cell 100 (e.g., a state stored by the capacitor 110), the access line 115 may be activated, and a voltage may be applied to the plate line 125. Applying a voltage to the plate line 125 may cause a change in the stored charge on the capacitor 110. The magnitude of the change in stored charge may depend on the stored state of capacitor 110 (e.g., whether the stored state is a logic "1" state or a logic "0" state). This may or may not induce a threshold change in the voltage of the digit line 120 based on the charge stored on the capacitor 110. The change in voltage or lack of change in voltage of the digit line 120 (or a magnitude of the change in voltage) may be used to determine the stored state of the capacitor 110. For example, if the change in voltage satisfies a threshold, then the read operation indicates that a first state was stored in the capacitor 110, whereas if the change in voltage does not satisfy the threshold, then the read operation determines that a second state was stored in the capacitor 110. In some cases, multiple threshold voltages may be used, such as when the capacitor is capable of storing more than two data states (e.g., for a multi-level cell, a triple-level cell, and so on).

In some cases, excess charge may build up or accumulate at the bottom electrode 135 of the memory cell 100, which may disrupt or disturb the reading of the stored state of the memory cell 100, and in some cases may cause incorrect data to be read from the memory cell 100. This excess charge buildup is sometimes called a memory cell disturbance, and a resulting read of the memory cell 100 affected by a memory cell disturbance is sometimes called a read disturbance.

As an example, excess charge may accumulate at the bottom electrode 135 of a memory cell 100 when the memory cell 100 is not accessed (e.g., the access line 115 and the gate 130 are deactivated), but one or more other memory cells coupled to the digit line 120 are accessed. When the accessed memory cells are read, the voltage applied to the plate line(s) 125 coupled to the accessed memory cells causes a corresponding voltage on the digit line 120 because the capacitors of the accessed memory cells discharge the plate line voltage through the gates of the accessed memory cells to the digit line 120. If the non-accessed memory cell 100 is coupled to a leaky transistor 105, then the voltage on the digit line 120 may leak through the transistor 105 to the bottom electrode 135 of the non-accessed memory cell 100. Repeated accesses to memory cells that share the digit line 120 with the non-accessed memory cell 100 may cause further accumulation in charge on the bottom electrode 135 of the non-accessed memory cell 100. As a result, reading of the memory cell 100 becomes less reliable, and the capacitor 110 may even become depolarized from an intended (e.g., programmed) state.

Some implementations described herein use a leaker device 155 to dissipate excess charge from the bottom electrode 135. The leaker device 155 may couple the bottom electrode to a cell plate 150. The leaker device 155 may include or may be a resistor 160 configured with appropriate resistance to discharge excess charge from the bottom electrode 135 to the cell plate 150 without discharging too much charge from the bottom electrode 135 (e.g., such that the capacitor 110 can maintain an appropriate charge or polarity to store correct data). Furthermore, some implementations described herein enable leaker devices 155 associated with different memory cells 100 (e.g., a first leaker device 155 coupled to a first memory cell 100, a second leaker device 155 coupled to a second memory cell, and so on) to be formed with reduced variation in electrical properties across those leaker devices, which enables more robust and reliable memory device operation. In some implementations, leaker devices 155 associated with different memory cells 100 may be formed with one or more substantially identical electrical properties (e.g., with less than a threshold degree of variation), such as a substantially identical conductivity, a substantially identical resistance, or the like. Additionally, some implementations described herein may reduce process variation during memory device fabrication and/or may increase manufacturing yield. For example, some implementations described herein may reduce the likelihood that a leaker device 155 is impinged or otherwise rendered ineffective at discharging excess charge.

As indicated above, FIG. 1 is provided as an example. Other examples may differ from what is described with respect to FIG. 1.

Figure 2:
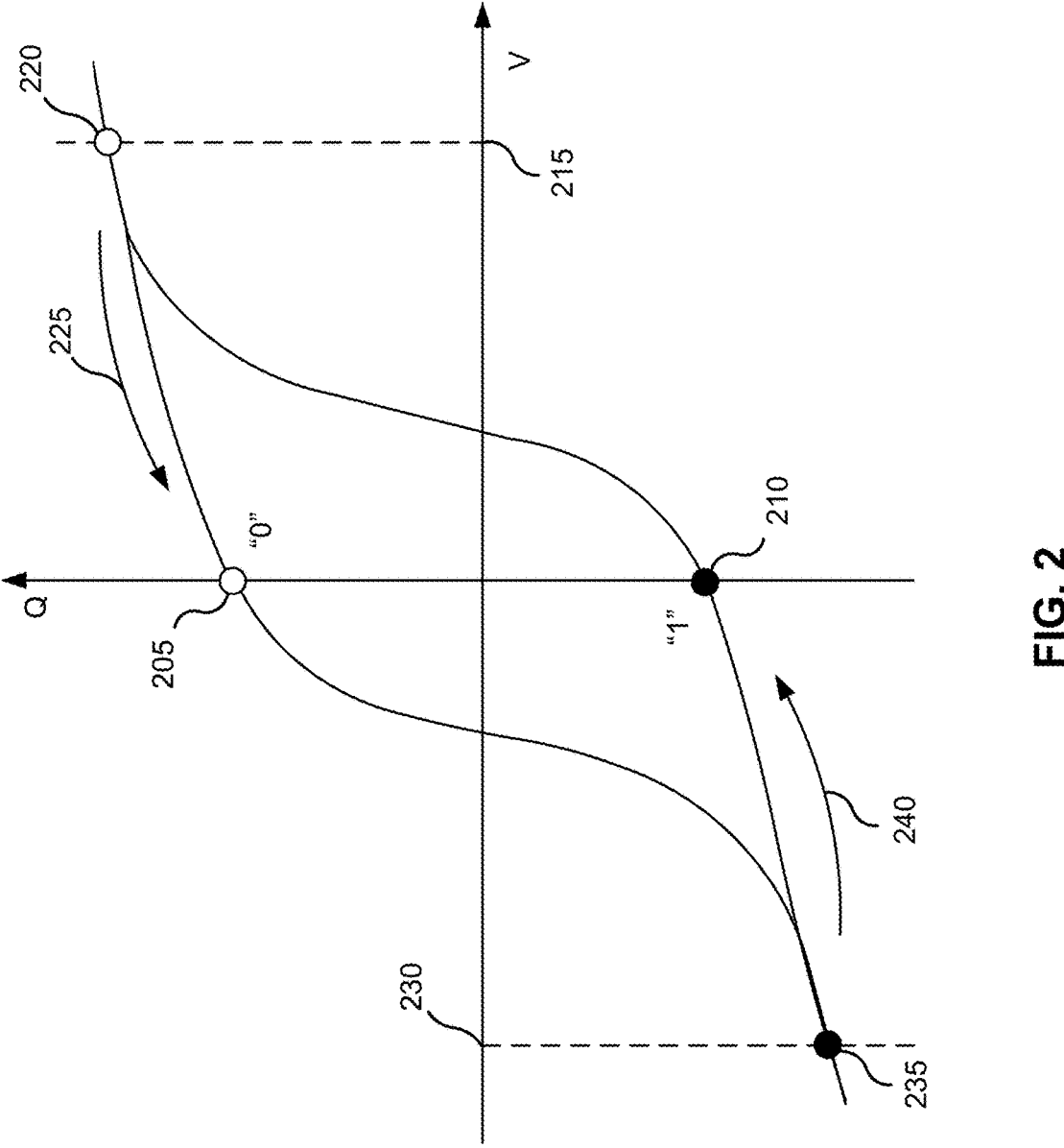
FIG. 2 is a diagram illustrating an example of electrical properties of ferroelectric material.

FIG. 2 is a diagram illustrating an example 200 of electrical properties of ferroelectric material. The example 200 shows an example hysteresis curve for a ferroelectric material. The hysteresis curve shows a charge (Q) stored on a capacitor (e.g., capacitor 110) as a function of a voltage difference (V) across the capacitor 110 (e.g., across the bottom electrode 135 and the top electrode 140).

A ferroelectric material is characterized by spontaneous electric polarization that can be reversed by the application of an external electric field. A ferroelectric material maintains a non-zero electric polarization in the absence of an external electric field. In contrast, a linear dielectric material or a paraelectric material exhibits polarization only in the presence of an electric field. Electric polarization within a ferroelectric capacitor 110 (e.g., within the ferroelectric material of the insulator 145) results in a charge, at surfaces of the ferroelectric material, that attracts opposite charges from the capacitor electrodes. Thus, charge is stored at the interface of the insulator 145 and the bottom electrode 135, and charge is stored at the interface of the insulator 145 and the top electrode 140.

As shown in FIG. 2, the ferroelectric material may maintain a positive or negative charge with a zero voltage difference across the capacitor 110, resulting in two possible charge states: charge state 205 and charge state 210. In the example 200 of FIG. 2, charge state 205 represents a logic "0" state, and charge state 210 represents a logic "1" state. In some examples, the logic values of the respective charge states may be reversed.

A logic "0" or a logic "1" may be written to the memory cell 100 by controlling the electric polarization of the insulator 145, and thus the charge on the capacitor electrodes 135 and 140, by applying a voltage across the capacitor 110.

For example, applying a positive voltage 215 across the capacitor 110 results in positive charge accumulation until charge state 220 is reached. As the positive voltage 215 is removed, the charge state of the insulator 145 changes from charge state 220 to charge state 205 (e.g., along the path 225), which is reached at zero volts and represents a logic "0" state. Similarly, applying a negative voltage 230 across the capacitor 110 results in negative charge accumulation until charge state 235 is reached. As the negative voltage 230 is removed, the charge state of the insulator 145 changes from charge state 235 to charge state 210 (e.g., along the path 240), which is reached at zero volts and represents a logic "1" state. Charge states 205 and 210 may also be referred to as the remnant polarization (Pr) values, which is the remaining polarization (and thus the charge) upon removing the external bias (e.g., voltage).

As indicated above, FIG. 2 is provided as an example. Other examples may differ from what is described with respect to FIG. 2.

Figure 3:
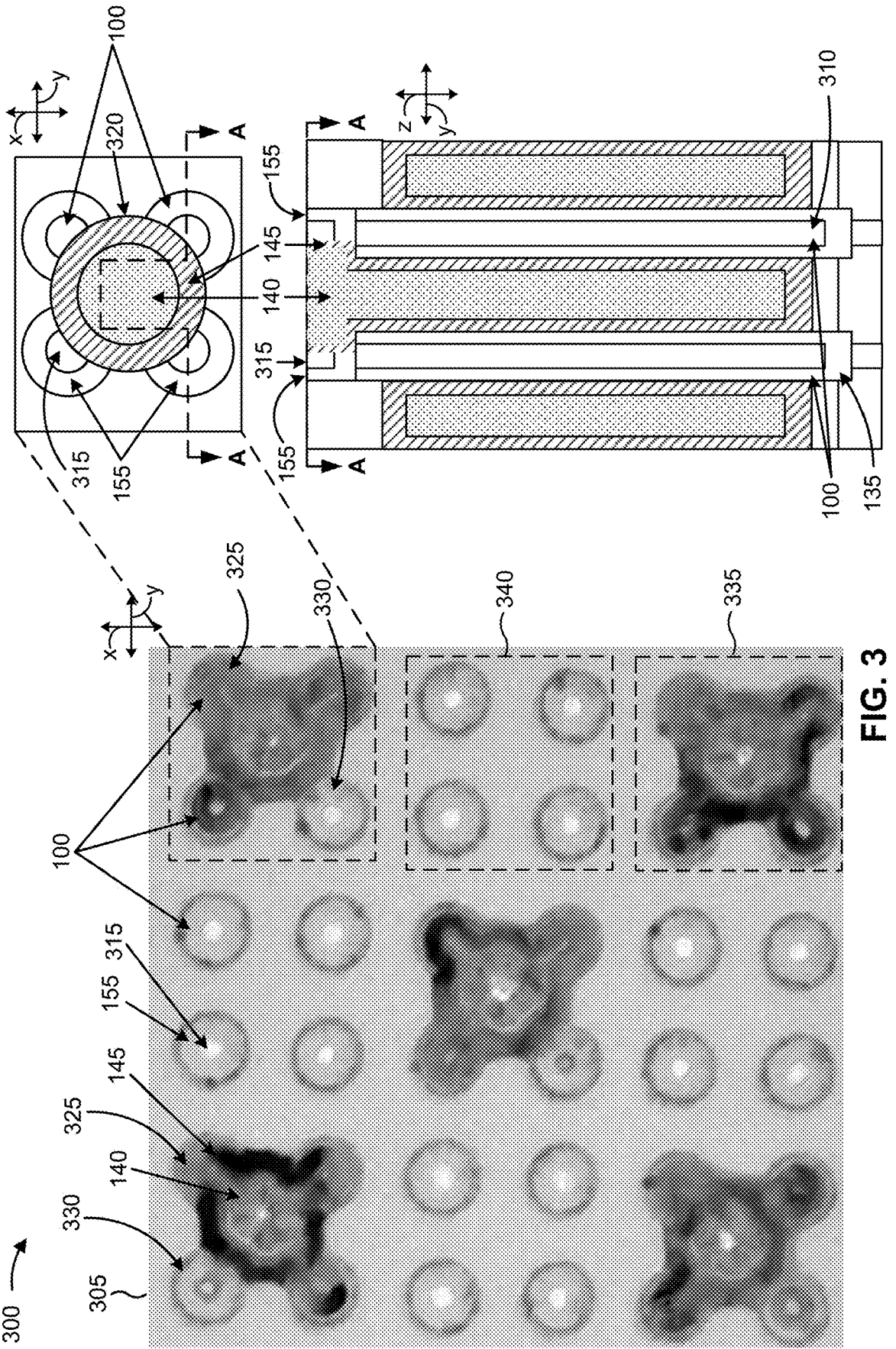
FIG. 3 is a diagram illustrating examples of impinged leaker devices.

FIG. 3 is a diagram illustrating examples of impinged leaker devices. FIG. 3 shows a structure 300 that is a portion of a memory array 305 that includes multiple memory cells 100. As described above in connection with FIG. 1, a memory cell 100 may include a transistor (not shown) and a capacitor that includes a bottom electrode 135, a top electrode 140, and an insulator 145. The bottom electrode may be coupled to a leaker device 155. The leaker device may be coupled to a cell plate (not shown), which may be on top of a top surface of the leaker device 155. In some implementations, a support pillar 310 and/or leaker fill material 315 may support the memory cell 100.

During a manufacturing process, an opening 320 may be formed after forming bottom electrodes 135 (and support pillars 310, if included in the structure 300). The opening 320 may be used to fill the structure 300 with the insulator 145 and the top electrode 140. Due to process variation and/or a manner in which the opening 320 is formed, the insulator 145 and/or the top electrode 140 may impinge one or more leaker devices 155, which impacts electrical properties of those leaker devices 155. For example, an impinged leaker device may have a different electrical resistance (e.g., lower or higher, depending on manner of the impingement) and/or a different electrical conductivity (e.g., lower or higher, depending on a manner of the impingement) than a non-impinged leaker device. Impingement of a leaker device 155 may result from removal (e.g. etching) of a portion of the leaker device 155 when the opening 320 is formed. This impingement may alter an electrical property of the leaker device 155, such as a conductivity of the leaker device 155, a resistance of the leaker device 155, an amount of excess charge that the leaker device 155 is capable of discharging from the bottom electrode 135 to the cell plate, and/or a rate at which the leaker device 155 is capable of discharging excess charge from the bottom electrode 135 to the cell plate. In some cases, differences in electrical properties across different leaker devices 155 may be due to different amounts of surface area of those leaker devices 155 that are in contact with the cell plate and/or the bottom electrode 135. For example, a first leaker device 325 may have a smaller amount of surface area in contact with the cell plate and/or a bottom electrode, and a second leaker device 330 may have a greater amount of surface area in contact with the cell plate and/or a bottom electrode.

Furthermore, one or more leaker devices included in a first group 335 of leaker devices with the insulator and/or the top electrode between the first group 335 of leaker devices (e.g., at a top surface of the leaker devices) may have different electrical properties than one or more leaker devices included in a second group 340 of leaker devices that do not have the insulator and/or the top electrode between the second group 340 of leaker devices (e.g., at a top surface of the leaker devices). In this case, leaker devices in the first group 335 may be impinged, while leaker devices in the second group 340 may be non-impinged. This impingement may be due to leaker devices in the first group 335 having less surface area in contact with the cell plate and/or corresponding bottom electrodes as compared to leaker devices in the second group 340.

Some implementations described herein reduce impingement of leaker devices. This may result in leaker devices that have substantially identical electrical properties across leaker devices with the insulator and/or the top electrode between them (e.g., across leaker devices included in the first group 335). Additionally, or alternatively, this may result in leaker devices with substantially identical electrical properties across the entire memory array (e.g., across leaker devices included in the first group 335 and the second group 340). This enables more reliable and predictable operation of the memory array.

As indicated above, FIG. 3 is provided as an example. Other examples may differ from what is described with respect to FIG. 3.

Figure 4:
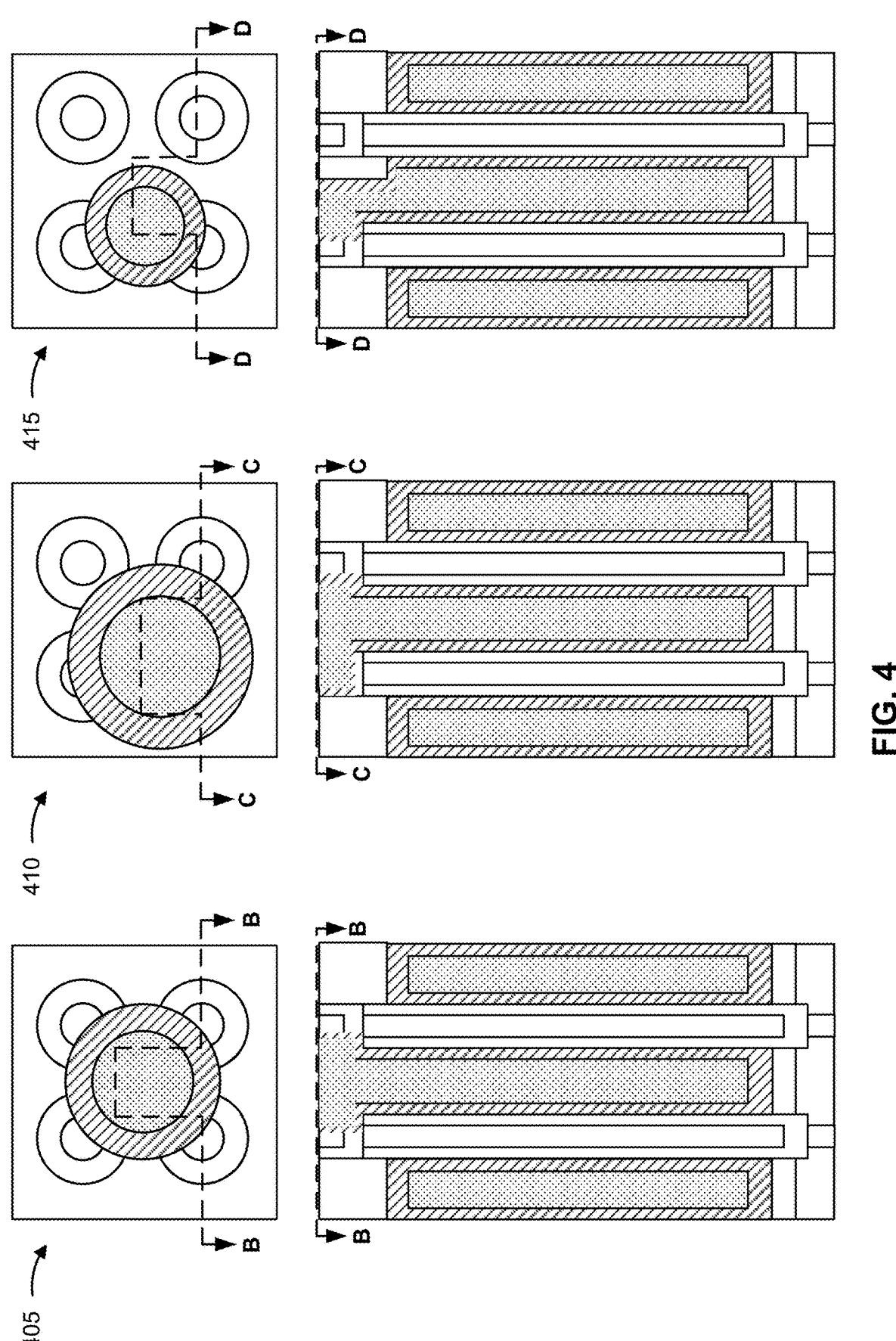
FIG. 4 is a diagram illustrating additional examples of impinged leaker devices.

FIG. 4 is a diagram illustrating additional examples of impinged leaker devices. Example 405 shows a larger opening with an ideal placement (e.g., centered between four leaker devices), example 410 shows a larger opening with a misaligned placement (e.g., not centered between the four leaker devices), and example 415 shows a smaller opening with a misaligned placement.

In example 405, the larger opening results in impingement of the leaker devices by the insulator and the top electrode, as described in greater detail above in connection with FIG. 3.

In example 410, one of the leaker devices is completely impinged, meaning that the leaker device does not couple the bottom electrode to the cell plate, and is not capable of discharging any excess charge from the bottom electrode to the cell plate. In this example, the insulator and the top electrode are entirely on top of the leaker device, blocking the coupling of the leaker device to the cell plate.

In example 415, the smaller opening results in partial impingement of two of the leaker devices and non-impingement of the other two leaker devices. Furthermore, the smaller opening may cause pinch-off, where the insulator and/or the top electrode are not sufficiently formed (e.g., deposited) within the structure via the smaller opening, which may cause structural and/or electrical issues.

Some implementations described herein reduce impingement of leaker devices in these and other examples. Furthermore, some implementations described herein reduce the likelihood of pinch-off, resulting in a more robust and reliable memory device.

As indicated above, FIG. 4 is provided as an example. Other examples may differ from what is described with respect to FIG. 4.

Figure 5A:
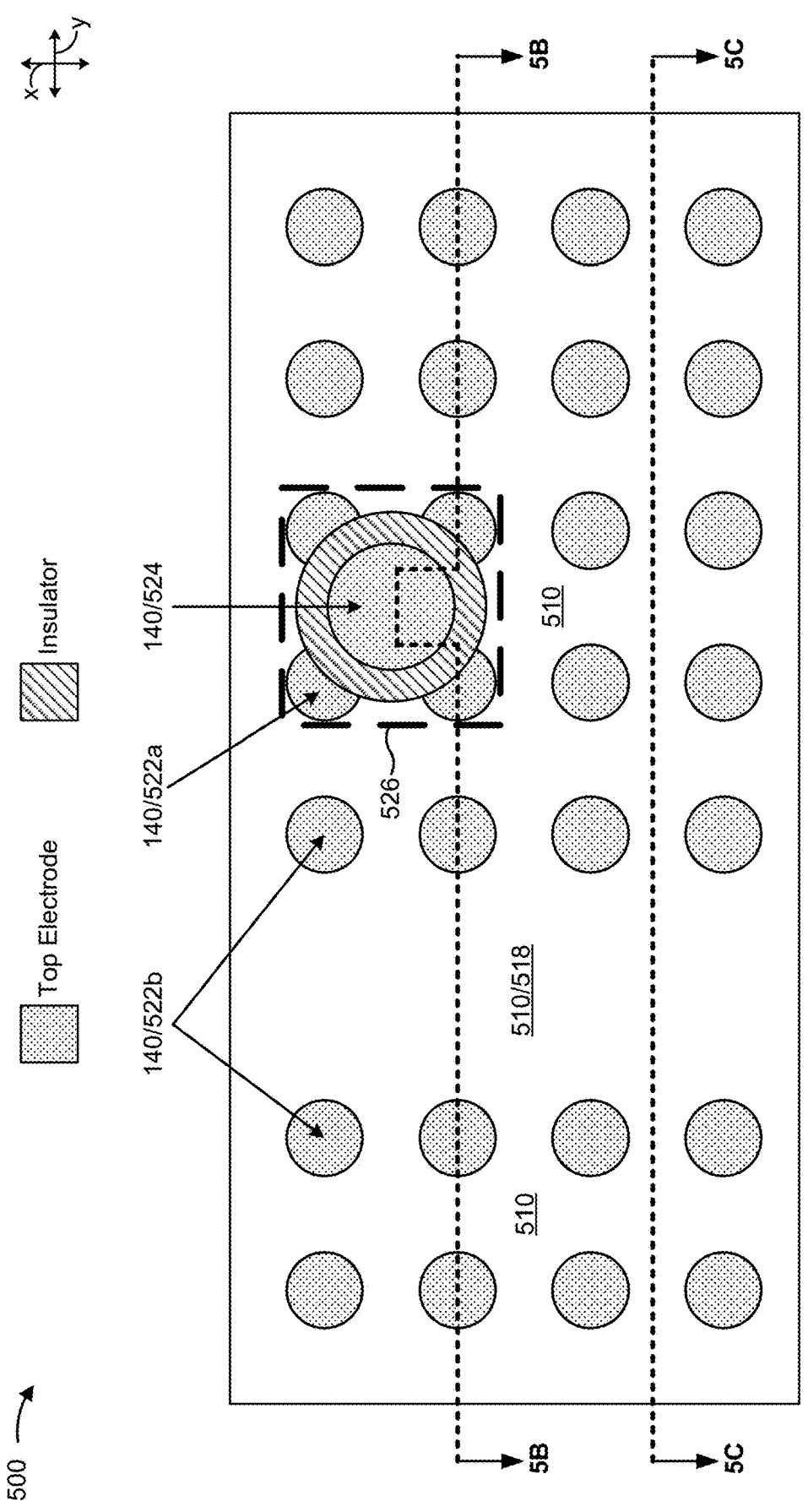
FIGS. 5A-5C are diagrammatic views of an example structure described herein.
Figure 5B:
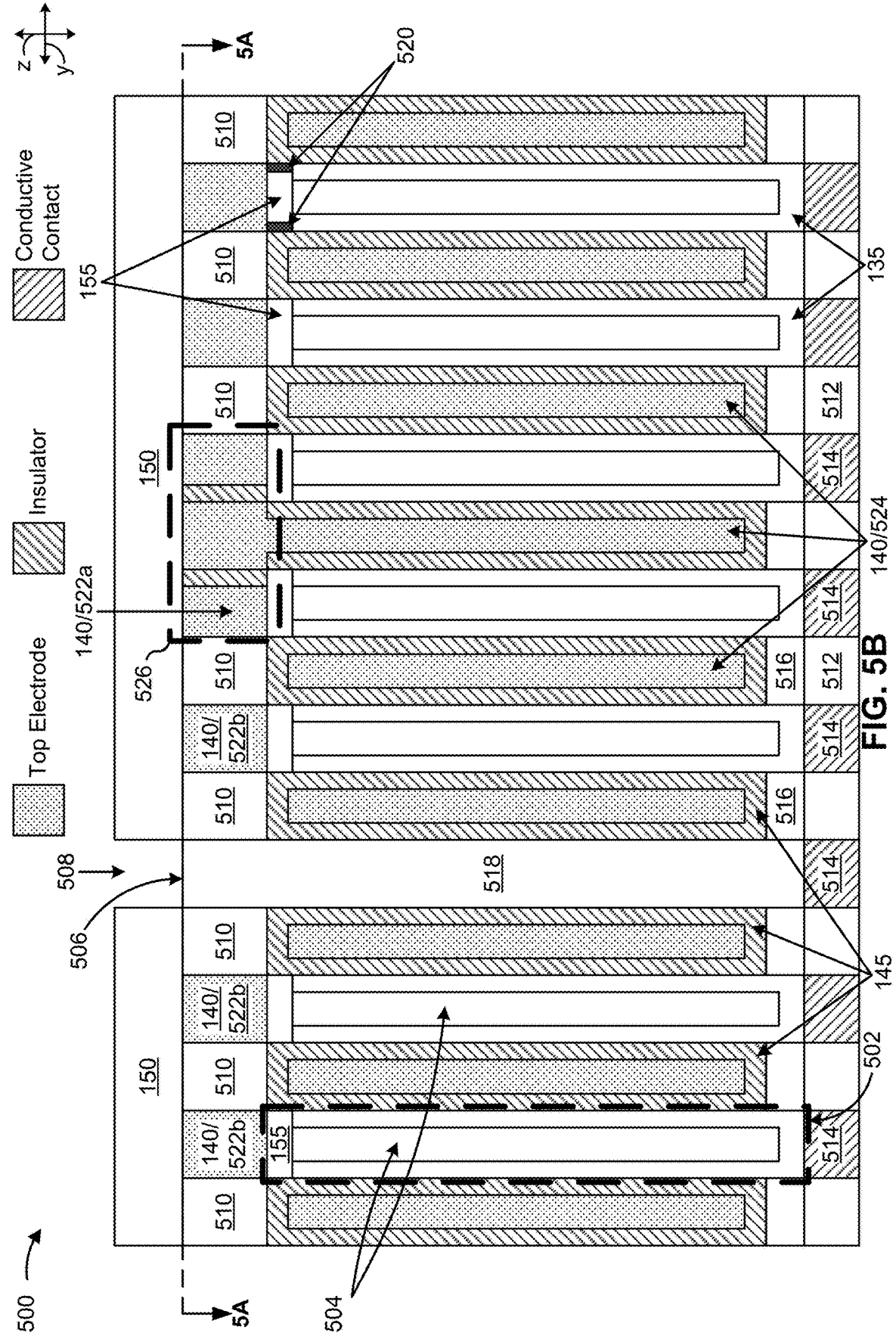
Figure 5C:
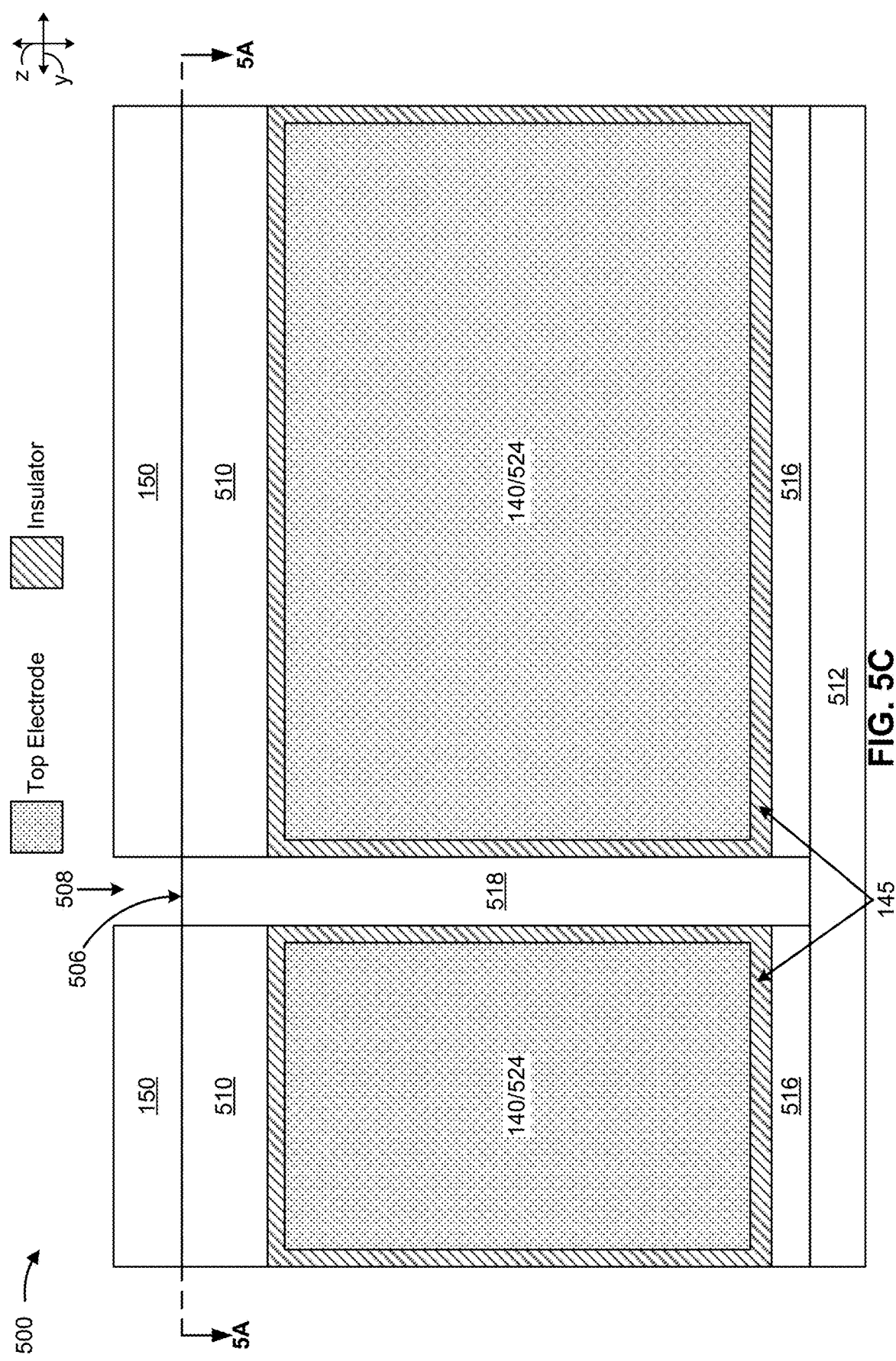

FIGS. 5A-5C are diagrammatic views of an example structure 500. The structure 500 may be part of an integrated assembly, such as a memory array, a portion of a memory array, or a memory device that includes the memory array and one or more other components (e.g., sense amplifiers, a row decoder, a column decoder, a row address buffer, a column address buffer, one or more data buffers, one or more clocks, one or more counters, and/or a memory controller).

As shown, the structure 500 includes multiple pillars 502. A pillar 502 includes a bottom electrode 135 and a leaker device 155 situated on top of the bottom electrode 135. In some implementations (as shown), a pillar 502 (e.g., each pillar 502) includes a support pillar 504. As further shown, the structure 500 includes multiple top electrodes 140, multiple insulators 145, and multiple cell plates 150. For example, the structure 500 may include multiple bounded regions, and each bounded region may include a single top electrode 140, a single insulator 145, and a single cell plate 150. The cell plates 150 may be directly on top of a horizontal surface 506 and may be separated by a gap 508. As further shown, the structure 500 may include a lattice structure 510, a first insulative layer 512, conductive contacts 514, a second insulative layer 516, and a separation structure 518. In some cases, the bottom electrode 135 may be called a first electrode or a lower electrode. Similarly, the top electrode 140 may be called a second electrode or an upper electrode. The pillar 502 may be called a bottom electrode pillar.

The support pillar 504 (if included in the structure 500) has a top surface, a bottom surface, and a circumferential surface. In some implementations, the shape of the support pillar 504 is a cylinder (within reasonable tolerances of manufacturing and measurement). In other words, the support pillar 504 may be substantially cylindrical in shape. In this case, the top surface is a top horizontal surface of the cylinder (e.g., having a circular shape or an elliptic shape), the bottom surface is the bottom horizontal surface of the cylinder (e.g., having a circular shape or an elliptic shape), and the circumferential surface is the vertical surface of the cylinder (e.g., having a tube shape that connects the circular or elliptic shapes on either end). The circumferential surface extends vertically from the top surface to the bottom surface along the entire circumference of the cylinder. As used herein, a "cylinder" may refer to a circular cylinder or an elliptic cylinder. Similarly, "cylindrical" may refer to a circular cylindrical shape or an elliptic cylindrical shape.

The support pillar 504 may be an electrical insulator, an electrical conductor, or a semiconductor, and may comprise, consist of, or consist essentially of insulative material, conductive material, or semiconductive material. For example, the support pillar 504 may comprise, consist of, or consist essentially of titanium silicon nitride, silicon nitride, silicon dioxide, and/or silicon (e.g., polycrystalline silicon).

The bottom electrode 135 has a top surface, a bottom surface, and an exterior circumferential surface. In some implementations, such as if the support pillar 504 is included in the structure 500, the bottom electrode 135 has an interior circumferential surface. In some implementations, such as if the support pillar 504 is not included in the structure 500, the shape of the bottom electrode 135 may be a cylinder, as described above in connection with the support pillar 504.

In some implementations, such as if the support pillar 504 is included in the structure 500, the shape of the bottom electrode 135 is an open top cylinder (within reasonable tolerances of manufacturing and measurement). An open top cylinder is a cylinder with one open end (e.g., the top end) and one closed end (e.g., the bottom end), and can be thought of as having the shape of a container or cup. In this case, the top surface is a top horizontal surface of the open top cylinder (e.g., having a ring shape or an annular shape), the bottom surface is the bottom horizontal surface of the open top cylinder (e.g., having a circular shape, a disc shape, or an elliptic shape), the interior circumferential surface is the interior vertical surface of the open top cylinder (e.g., having a tube shape that forms an interior wall of the open top cylinder), and the exterior circumferential surface is the exterior vertical surface of the open top cylinder (e.g., having a tube shape that forms an exterior wall of the open top cylinder). The interior circumferential surface extends vertically from the bottom surface of the support pillar 504 to the top surface of the bottom electrode 135 along the entire circumference of the smaller concentric circle of the annulus that forms the top surface. The exterior circumferential surface extends vertically from the bottom surface of the bottom electrode 135 to the top surface of the bottom electrode 135 along the entire circumference of the larger concentric circle of the annulus that forms the top surface. As used herein, an "annulus" may refer to a circle annulus or an ellipse annulus. Similarly, "annular" may refer to a circular annular shape or an elliptic annular shape.

As shown in FIG. 5B, in some implementations, the top surface of the bottom electrode 135 is substantially horizontally aligned with the top surface of the support pillar 504. However, in some implementations, the top surface of the bottom electrode 135 is vertically higher than the top surface of the support pillar 504. In this case, a portion of the leaker device 155 may be contained within the open top cylinder shape of the bottom electrode 135 (e.g., the leaker device 155 may extend vertically below the top surface of the bottom electrode 135).

In some implementations, the interior circumferential surface of the bottom electrode 135 interfaces with the circumferential surface of the support pillar 504. For example, the interior circumferential surface of the bottom electrode 135 may be along and abutting the circumferential surface of the support pillar 504. Additionally, or alternatively, the interior circumferential surface of the bottom electrode 135 may be substantially vertically aligned with the circumferential surface of the support pillar 504. As further shown, the bottom surface of the bottom electrode 135 is below the bottom surface of the support pillar 504. In some implementations, the support pillar 504 is contained within the open top cylinder shape of the bottom electrode 135. Although the bottom surface of the bottom electrode 135 is shown as being substantially horizontally aligned with the top surface of the first insulative layer 512 and the bottom surface of the second insulative layer 516, in some implementations, the bottom surface of the bottom electrode 135 is below the top surface of the first insulative layer 512 and/or the bottom surface of the second insulative layer 516.

The bottom electrode 135 may be an electrical conductor and may comprise, consist of, or consist essentially of conductive material. The conductive material may comprise, consist of, or consist essentially of a metal (e.g., titanium, tungsten, cobalt, nickel, platinum, and/or ruthenium), a metal composition (e.g., a metal silicide, a metal nitride, such as titanium nitride or titanium silicon nitride, and/or a metal carbide), and/or a conductively-doped semiconductor material (e.g., conductively-doped silicon, conductively-doped germanium, and/or conductively-doped gallium arsenide), among other examples. In some implementations, the bottom electrode 135 comprises, consists of, or consists essentially of titanium nitride.

The leaker device 155 has a top surface, a bottom surface, and an exterior circumferential surface. In some implementations, the leaker device 155 contains leaker fill material (not shown), which may be contained within the leaker device 155, similar to the support pillar 504 being contained within the bottom electrode 135, as described above. The leaker fill material may be an insulative material, as described elsewhere herein. In some implementations, the leaker device 155 does not contain leaker fill material (i.e., leaker fill material is not present in the structure 500). The presence or absence of leaker fill material may be used to control conductivity, resistivity, and/or other electrical properties of the leaker device 155.

In some implementations, such as if leaker fill material is included in the structure 500, the leaker device 155 has an interior circumferential surface. In some implementations, such as if leaker fill material is not included in the structure 500 (as shown), the shape of the leaker device 155 may be a cylinder, as described above in connection with the support pillar 504. In this case, the exterior circumferential surface of the leaker device 155 may extend vertically from the bottom surface of the leaker device 155 to the top surface of the leaker device 155 along the entire circumference of the cylinder.

In some implementations, such as if leaker fill material is included in the structure 500, the shape of the leaker device 155 may be an open top cylinder, as described above in connection with the bottom electrode 135. In this case, the interior circumferential surface of the leaker device 155 may extend vertically from a bottom surface of the leaker fill material to the top surface of the leaker device 155 along the entire circumference of the smaller concentric circle of the annulus that forms the top surface, and the exterior circumferential surface of the leaker device 155 may extend vertically from the bottom surface of the leaker device 155 to the top surface of the leaker device 155 along the entire circumference of the larger concentric circle of the annulus that forms the top surface.

As shown in FIG. 5B, in some implementations, a top surface of the leaker device 155 may be substantially horizontally aligned with a bottom surface of the lattice structure 510. Alternatively, a top surface of the leaker device 155 may be lower than a bottom surface of the lattice structure 510. In either case, the top surface of the leaker device 155 is not higher than the bottom surface of the lattice structure 510. This may help ensure that the leaker device 155 or a portion of the leaker device 155 is not removed during a removal process (e.g., an etching process) used to fabricate the structure 500, and therefore helps prevent variation in electrical properties and physical dimensions of different leaker devices 155 included in the structure. For example, the removal process may include forming an opening by removing all of the lattice structure 510, down to a bottom surface of the lattice structure 510, in a region of the structure 500 (e.g., the illustrated region 526). If any part of the leaker device 155 is higher than the bottom surface of the lattice structure 510, then that part of the leaker device 155 may be removed, which may cause variation (e.g., in electrical properties or physical dimensions) among different leaker devices 155. In some implementations, a respective top surface of each leaker device 155 is substantially flat (e.g., substantially horizontal) because the leaker devices 155 are protected from removal of material during the removal process.

As shown in FIG. 5B, in some implementations, the bottom surface of the leaker device 155 interfaces with the top surface of the bottom electrode 135 and/or the top surface of the support pillar 504. For example, the bottom surface of the leaker device 155 may abut and/or may be substantially horizontally aligned with the top surface of the bottom electrode 135 and/or the top surface of the support pillar 504. In some implementations, the bottom surface of the leaker device 155 does not extend vertically below the top surface of the bottom electrode 135 and/or the top surface of the support pillar 504. For example, in some implementations, the bottom surface of the leaker device 155 does not extend vertically below the top surface of the bottom electrode 135 and does not extend vertically below the top surface of the support pillar 504, as shown in FIG. 5B. In such implementations, the bottom surface of the leaker device 155 does not contact any surface of the bottom electrode 135 other than the top surface of the bottom electrode 135. For example, in some implementations, the bottom surface of the leaker device 155 does not contact the interior circumferential surface of the bottom electrode 135. Similarly, in some implementations, the bottom surface of the leaker device 155 does not contact the exterior circumferential surface of the bottom electrode 135. In this case, the bottom surface of the leaker device 155 may be substantially horizontal.

However, in some implementations, the bottom surface of the leaker device 155 extends vertically below the top surface of the bottom electrode 135, but does not extend vertically below the top surface of the support pillar 504. For example, the leaker device 155 may be partially contained within the open top cylinder shape of the bottom electrode 135 (e.g., and may abut the top surface of the support pillar 504). This may increase a surface area of the leaker device 155 in contact with the bottom electrode 135, which may impact a resistance of the leaker device 155. In such implementations, the top surface of the support pillar 504 is vertically lower than and not substantially horizontally aligned with the top surface of the bottom electrode 135. Furthermore, in such implementations, the leaker device 155 may contact a portion of the interior circumferential surface of the bottom electrode 135. In this case, the bottom surface of the leaker device 155 may not be substantially horizontal. For example, a first portion of the bottom surface of the leaker device 155 may abut the top surface of the bottom electrode 135, and a second portion of the bottom surface of the leaker device 155 may abut the top surface of the support pillar 504 (e.g., where the second portion is vertically lower than the first portion). In this case, the leaker device 155 may have a bottom surface that is not flat (e.g., not substantially horizontal). In some implementations, the bottom surface of the leaker device 155 is less than or equal to approximately 5 nanometers below the top surface of the bottom electrode 135.

As further shown, the exterior circumferential surface of the leaker device 155 may be substantially vertically aligned with the exterior circumferential surface of the bottom electrode 135. For example, the exterior circumferential surface of the leaker device 155 may be substantially vertically aligned with the exterior circumferential surface of the bottom electrode 135 along an entire circumference of the exterior circumferential surface and an entire circumference of the exterior circumferential surface. As further shown, the exterior circumferential surface of the leaker device 155 may interface with (e.g., may be along, may abut, and/or may be in contact with) the insulator 145.

However, in some implementations, the structure 500 includes a leaker liner 520, in which case the exterior circumferential surface of the leaker device 155 may interface with the leaker liner 520. A leaker liner 520 is illustrated in FIG. 5B with respect to a single leaker device 155. However, if the leaker liner 520 is present in the structure 500, then each leaker device 155 may have a leaker liner 520. The leaker liner 520 may have an annular cylinder shape (e.g., a ring or cylindrical shell), and may wrap around the vertical surface (e.g., the exterior vertical surface or exterior circumferential surface) of the leaker device 155. For example, an interior vertical surface of the leaker liner 520 may interface with (e.g., may be along, may abut, and/or may be in contact with) the exterior vertical surface of the leaker device 155. In some implementations, the interior vertical surface of the leaker liner 520 contacts an entirety of the exterior vertical surface of the leaker device 155.

An exterior vertical surface of the leaker liner 520 may interface with (e.g., may be along, may abut, and/or may be in contact with) the insulator 145, as shown in FIG. 5B. As also shown, a bottom surface of the leaker liner 520 may interface with a bottom electrode 135, and a top surface of the leaker liner 520 may interface with a top electrode 140 (e.g., a first top electrode portion 522, described below). The leaker liner 520 may have a horizontal thickness (e.g., along the illustrated y-axis) that enables the leaker device 155 to be in contact with the bottom electrode 135, such that the leaker device 155 can discharge excess charge from the bottom electrode 135 to the cell plate (e.g., via a first top electrode portion 522, described below). For example, the leaker liner 520 may have a horizontal thickness that is less than a radius of the bottom electrode (e.g., when the support pillar 504 is not present and the bottom electrode has a cylinder shape) or that is less than a horizontal thickness of an annulus formed by the top surface of the bottom electrode 135 (e.g., when the support pillar 504 is present and the bottom electrode 135 has an open top cylinder shape).

The leaker liner 520 may be an electrical insulator and may comprise, consist of, or consist essentially of insulative material. The insulative material may comprise, consist of, or consist essentially of silicon dioxide and/or silicon nitride, among other examples. In some implementations, the leaker liner 520 comprises, consists of, or consists essentially of a nitride. This may protect the leaker device 155 from exhume chemistry used to exhume material from the structure 500 during a fabrication process, as described in more detail elsewhere herein. This may prevent a portion of the leaker device 155 from being removed when other material is being exhumed from the structure 500, which reduces variation in electrical properties across leaker devices 155.

The leaker device 155 may be an electrical conductor and may comprise, consist of, or consist essentially of conductive material. The conductive material may comprise, consist of, or consist essentially of a metal (e.g., titanium, tungsten, cobalt, nickel, platinum, and/or ruthenium), a metal composition (e.g., a metal silicide, a metal nitride, such as titanium nitride, and/or a metal carbide), and/or a conductively-doped semiconductor material (e.g., conductively-doped silicon, conductively-doped germanium, and/or conductively-doped gallium arsenide). In some implementations, the leaker device 155 may be a same material as or a different material than the bottom electrode 135. In some implementations, the leaker device 155 comprises, consists of, or consists essentially of a conductively-doped semiconductor material (e.g., conductively-doped silicon dioxide or conductively-doped germanium), an oxide (e.g., aluminum oxide), silicon (e.g., amorphous silicon), a nitride (e.g., silicon nitride or titanium silicon nitride), or an oxynitride (e.g., titanium oxynitride, niobium oxynitride, or nickel oxynitride). These materials may enable the leaker device 155 to achieve appropriate electrical resistance to prevent a short between the bottom electrode 135 and the top electrode 140 (e.g., a first top electrode portion 522, described below), to achieve sufficient electrical conductivity to discharge excess charge from the bottom electrode 135 to the cell plate via the top electrode 140 (e.g., via a first top electrode portion 522, described below), and to prevent removal of the leaker device 155 during a semiconductor fabrication process (e.g., when material is being exhumed from the structure 500, described below).

In some implementations, the leaker device 155 may be formed with dimensions that assist with achieving appropriate electrical resistance to prevent a short between the bottom electrode 135 and the top electrode and to achieve sufficient electrical conductivity to discharge excess charge from the bottom electrode 135 to the cell plate via the top electrode 140. For example, the leaker device 155 may have a height in a range from approximately 10 angstroms to approximately 100 angstroms. In some implementations, the leaker device 155 may have a height in a range from approximately 10 angstroms to approximately 30 angstroms. In some implementations, the leaker device 155 may have a height in a range from approximately 10 angstroms to approximately 20 angstroms. In some implementations, the leaker device 155 may have a height that is greater than or equal to approximately 10 angstroms. In some implementations, the leaker device 155 may have a height that is less than or equal to approximately 100 angstroms. In some implementations, the leaker device 155 may have a height that is less than or equal to approximately 30 angstroms. In some implementations, the leaker device 155 may have a height that is less than or equal to approximately 20 angstroms. In some implementations, all of the leaker devices 155 (e.g., across the structure 500, included in different capacitors 110, and/or included in different memory cells 100) may have substantially identical physical dimensions to provide more reliable performance of the memory device, as described elsewhere herein. For example, all of the leaker devices 155 may have a substantially identical height, a substantially identical width, a substantially identical diameter, and/or a substantially identical shape.

The insulator 145 has a top surface, a bottom surface, and a plurality of vertical surfaces. In some implementations, the top surface of the insulator 145 is substantially horizontally aligned with the top surface of the leaker device 155 and/or the top surface of leaker fill material (if included in the structure 500). Additionally, or alternatively, the top surface of the insulator 145 may be vertically higher than the top surface of the support pillar 504 and/or the top surface of the bottom electrode 135. However, in some implementations, the insulator 145 (e.g., insulative material of the insulator) is not above or on top of the support pillar 504 and/or the bottom electrode 135. In other words, in some implementations, the insulator 145 is not present in an area above the bottom electrode 135 bounded by an imaginary upward extension of the exterior circumferential surface of the bottom electrode 135. Similarly, in some implementations, the insulator 145 is not present in an area above the support pillar 504 bounded by an imaginary upward extension of the circumferential surface of the support pillar 504.

In some implementations, the bottom surface of the insulator 145 is vertically higher than the bottom surface of the support pillar 504 and/or the bottom surface of the bottom electrode 135. As shown in FIGS. 5B and 5C, the bottom surface of the insulator 145 may interface with the second insulative layer 516. For example, the bottom surface of the insulator 145 may abut and/or may be substantially horizontally aligned with a top surface of the second insulative layer 516.

In some implementations, each vertical surface of the insulator 145 interfaces with a respective bottom electrode 135 (except for a vertical surface of the insulator 145 that interfaces with the separation structure 518). For example, each vertical surface of the insulator 145 may interface with the exterior circumferential surface of a different bottom electrode 135. For example, a vertical surface of the insulator 145 may be along, may abut, and/or may be in contact with the exterior circumferential surface of a bottom electrode 135. In some implementations, the vertical surface of the insulator 145 wraps completely around a circumference of the exterior circumferential surface of the bottom electrode 135 (although not necessarily along an entire height of the exterior circumferential surface of the bottom electrode 135). As further shown, the insulator 145 may interface with (e.g., may be along, may abut, may be in contact with, and/or may wrap completely around) the exterior circumferential surfaces of multiple bottom electrodes 135 (e.g., all bottom electrodes 135 that are between consecutive separation structures 518, with no intervening separation structures 518).

In some implementations, each vertical surface of the insulator 145 interfaces with a respective leaker device 155 (except for a vertical surface of the insulator 145 that interfaces with the separation structure 518). For example, each vertical surface of the insulator 145 may interface with the exterior circumferential surface of a different leaker device 155. For example, a vertical surface of the insulator 145 may be along, may abut, and/or may be in contact with the exterior circumferential surface of a leaker device 155. In some implementations, the vertical surface of the insulator 145 wraps completely around a circumference of the exterior circumferential surface of the leaker device 155. As further shown, the insulator 145 may interface with (e.g., may be along, may abut, may be in contact with, and/or may wrap completely around) the exterior circumferential surfaces of multiple leaker devices 155 (e.g., all leaker devices 155 that are between consecutive separation structures 518, with no intervening separation structures 518).

The insulator 145 may be an electrical insulator and may comprise, consist of, or consist essentially of insulative material. The insulative material may comprise, consist of, or consist essentially of silicon dioxide and/or silicon nitride, among other examples. In some implementations, the insulator 145 comprises, consists of, or consists essentially of ferroelectric material. The ferroelectric material may comprise, consist of, or consist essentially of hafnium oxide, hafnium zirconium oxide, barium titanate, lead titanate, lead zirconate titanate, and/or strontium bismuth tantalate, among other examples.

The top electrode 140 may include a first top electrode portion 522 (shown as 522a and 522b in FIGS. 5A and 5B) and a second top electrode portion 524. As shown in FIG. 5B, in some implementations, a first top electrode portion 522 is separated from a bottom electrode 135 by the leaker device 155. In some implementations, each first top electrode portion 522 (e.g., in the structure 500) is separated from a corresponding bottom electrode 135 by a corresponding leaker device 155. Additionally, or alternatively, a first top electrode portion 522 may be situated on top of a leaker device 155. For example, each first top electrode portion 522 (e.g., in the structure 500) may be on top of a corresponding leaker device. In this case, a bottom surface of a first top electrode portion 522 may interface with (e.g., may be along, may abut, and/or may be in contact with) a top surface of a leaker device 155.

As further shown in FIG. 5B, a first top electrode portion 522 (e.g., each first top electrode portion 522) may be in contact with a cell plate 150 (and may be under the cell plate 150). For example, a top surface of the first top electrode portion 522 may be in contact with a bottom surface of the cell plate 150. Thus, a first top electrode portion 522 may be directly in contact with the leaker device 155 and a cell plate 150. In some implementations, the shape of the first top electrode portion 522 may be a cylinder, as described above in connection with the support pillar 504. As further shown, a first top electrode portion 522 (e.g., each first top electrode portion 522) may be in contact with the lattice structure 510. For example, an exterior vertical surface of a first top electrode portion 522 (e.g., an exterior circumferential surface) may be in contact with the lattice structure 510.

In some implementations, a first top electrode portion 522a that is present in a region 526 may be different from a first top electrode portion 522b that is outside of the region 526. For example, the first top electrode portion 522a may be smaller than (e.g., may include less material than) the first top electrode portion 522b, which may be due to removal (e.g., etching) of material, including the first top electrode portion 522a, within the region 526. For example, the region 526 may be created by forming an opening in the lattice structure 510, as described in more detail elsewhere herein. As shown in FIG. 5A and FIG. 5B, the second top electrode portion 524 may be present in the region 526. In some implementations, an entirety of the exterior vertical surface of the first top electrode portion 522b is in contact with the lattice structure 510, while only a portion of the exterior vertical surface of the first top electrode portion 522a is in contact with the lattice structure 510 (e.g., with the remaining portion of the exterior vertical surface of the first top electrode portion 522a being in contact with the insulator 145). In some implementations, if the structure 500 includes leaker liners 520, then a first portion of the top surface of a leaker liner 520 may interface with a first top electrode portion 522a and a second portion of the top surface of the leaker liner 520 may interface with the insulator 145 within the region 526 (or proximate to the region 526).

As further shown in FIG. 5B, the second top electrode portion 524 is separated from the bottom electrode 135 by the insulator 145. The second top electrode portion 524 has a bottom surface, a top surface, and a plurality of vertical surfaces. In some implementations, the top surface of the second top electrode portion 524, within the region 526, is in contact with the cell plate 150. Additionally, or alternatively, within the region 526, the top surface of the second top electrode portion 524 may be substantially horizontally aligned with the top surface of the insulator 145 and/or respective top surfaces of the first top electrode portions 522. Additionally, or alternatively, the top surface of the second top electrode portion 524 may be substantially horizontally aligned with a top surface of the lattice structure 510. In some implementations, the second top electrode portion 524 is not in contact with the lattice structure 510. For example, the second top electrode portion 524 may be separated from the lattice structure 510 by the insulator 145, as shown in FIGS. 5B and 5C. In other words, the insulator 145 may be between the lattice structure 510 and the second top electrode portion 524 such that the lattice structure 510 is not in contact with the second top electrode portion 524.

In some implementations, a vertical surface of the second top electrode portion 524 interfaces with (e.g., is along, abutting, and/or in contact with) a vertical surface of the insulator 145 (e.g., along an entire height of that vertical surface of the second top electrode portion 524) and/or is substantially vertically aligned with the vertical surface of the insulator 145. As further shown, the bottom surface of the insulator 145 is below the bottom surface of the second top electrode portion 524.

The top electrode 140 may be shared among multiple bottom electrodes 135 (e.g., all bottom electrodes 135 that are between consecutive separation structures 518, with no intervening separation structures 518). Leaker devices 155 may separate respective first top electrode portions 522 of the top electrode 140 from respective bottom electrodes 135. The insulator 145 may separate the second top electrode portion 524 of the top electrode 140 from the multiple bottom electrodes 135. In some implementations, the structure 500 includes a single top electrode 140 (or a single second top electrode portion 524) between consecutive separation structures 518. Each bounded region of the structure 500 that is bounded by separation structures 518 and/or array edges may include a corresponding top electrode 140 that is shared among all bottom electrodes 135 and/or memory cells 100 within that bounded region. The voltage of a cell plate 150 may be controlled to control a voltage of a top electrode 140 coupled to the cell plate 150. The bottom electrodes 135 may be separately controlled from one another (e.g., via respective digit lines 120) so that a voltage difference between top and bottom electrodes can be controlled by manipulating the voltage of the cell plate 150 and the voltage of digit lines 120.

The top electrode 140 may be an electrical conductor and may comprise, consist of, or consist essentially of conductive material. The conductive material may comprise, consist of, or consist essentially of a metal (e.g., titanium, tungsten, cobalt, nickel, platinum, and/or ruthenium), a metal composition (e.g., a metal silicide, a metal nitride, such as titanium nitride, titanium silicon nitride, and/or a metal carbide), and/or a conductively-doped semiconductor material (e.g., conductively-doped silicon, conductively-doped germanium, and/or conductively-doped gallium arsenide), among other examples. In some implementations, the top electrode 140 comprises, consists of, or consists essentially of titanium nitride and/or titanium silicon nitride. In some implementations, the first top electrode portion 522 may comprise, consist of, or consist essentially of the same material as the second top electrode portion 524.

The cell plate 150 may interface with (e.g., may be along, abutting, and/or in contact with) the horizontal surface 506. The horizontal surface 506 may span across multiple memory cells (e.g., a large number of memory cells), such as an entire memory array (although the cell plate 150 may not span across the entire memory array due to gaps between cell plates, as described below). As shown in FIG. 5B, the horizontal surface 506 may be substantially horizontally aligned with the top surface of the top electrode 140 (e.g., the top surface of the second top electrode portion 524 within the region 526 and respective top surfaces of first top electrode portions 522), the top surface of the insulator 145 (e.g., within the region 526), and/or the top surface of the lattice structure 510.

The cell plate 150 may be an electrical conductor and may comprise, consist of, or consist essentially of conductive material. The conductive material may comprise, consist of, or consist essentially of a metal (e.g., titanium, tungsten, cobalt, nickel, platinum, and/or ruthenium), a metal composition (e.g., a metal silicide, a metal carbide, and/or a metal nitride, such as titanium nitride or titanium silicon nitride), and/or a conductively-doped semiconductor material (e.g., conductively-doped silicon, conductively-doped germanium, and/or conductively-doped gallium arsenide), among other examples. In some implementations, the cell plate 150 is a different material than the bottom electrode 135, the top electrode 140, and/or the leaker device 155. In some implementations, the cell plate 150 is a same material as the top electrode 140. In some implementations, the structure 500 may be formed such that the structure 500 is filled with conductive material of the cell plate 150 (e.g., via the opening and after filling the opening with the insulator 145 and the top electrode 140). In this case, the conductive material of the cell plate 150 may be along, abutting, and/or in contact with a vertical surface of a top electrode 140.

In some implementations, a gap 508 may be formed between cell plates 150. The gap 508 may extend along the x-direction illustrated in FIG. 5A. In some implementations, a width of the gap 508 (in the illustrated y-direction) may be less than or equal to approximately 50 nanometers, or may be in a range from approximately 10 nanometers to approximately 50 nanometers. As a result of forming the gap 508, multiple cell plates 150 may be present in the structure 500. Each cell plate 150 may span and/or cover a portion of the memory array. The cell plates 150 may be electrically isolated from one another. Thus, each cell plate 150 may be configured to independently interact with a portion of memory cells in the memory array (e.g., may interact with top electrode(s) 140 associated with those memory cells). A cell plate 150 may be coupled with a top electrode 140 that is associated with all memory cells in a bounded region of the memory array, where the bounded region is bounded by consecutive separation structures 518 (and/or one or more edges of the memory array). Different cell plates 150 may be coupled with different top electrodes 140 (e.g., a first cell plate 150 may be coupled with a first top electrode 140, a second cell plate 150 may be coupled with a second top electrode 140, and so on). Additionally, or alternatively, the cell plate 150 may extend horizontally along a top surface of a top electrode 140 and/or along top surfaces of multiple leaker devices 155. Having different cell plates 150 in the memory device allows different voltages to be applied to different groups of memory cells (e.g., that share a top electrode 140).

A leaker device 155 may separate a bottom electrode 135 from a first top electrode portion 522, and the first top electrode portion 522 may separate the leaker device 155 from the cell plate 150. The leaker device 155 may be configured to discharge excess charge (or at least a portion of excess charge) from the bottom electrode 135 to the cell plate 150 via the first top electrode portion 522. The leaker device 155 may be configured with an electrical resistance to enable removal of excess charge from the bottom electrode 135 without removing too much charge from the bottom electrode 135 (e.g., without electrically shorting the bottom electrode 135 and the top electrode 140 to one another). In some implementations, a resistance (or conductivity) of the leaker device 155 may be configured by forming the leaker device 155 with a particular circumference, with a particular height (e.g., between approximately 10 angstroms and approximately 100 angstroms, and/or with a particular material (e.g., aluminum oxide, amorphous silicon, silicon nitride, titanium oxynitride, niobium oxynitride, titanium silicon nitride, nickel oxynitride, or conductively-doped germanium), among other examples.

In some implementations, the leaker devices 155 in the structure 500 have substantially identical electrical properties. The substantially identical electrical properties may include, for example, a substantially identical electrical conductivity, a substantially identical electrical resistance, a capability to discharge a substantially identical amount of excess charge from a respective bottom electrode, and/or a capability to discharge excess charge at a substantially identical rate of discharge. This enables more reliable and predictable operation of the memory array.

The separation structure 518 may extend vertically from the first insulative layer 512 (and/or a conductive contact

514) to a top surface of the separation structure 518, which may be substantially horizontally aligned with the horizontal surface 506 and/or any other surfaces described herein as being substantially horizontally aligned with the horizontal surface 506. Thus, a bottom surface of the separation structure 518 may interface with (e.g., may be along, abutting, and/or in contact with) a top surface of the first insulative layer 512 and/or a top surface of a conductive contact 514. Alternatively, a bottom surface of the separation structure 518 may interface with (e.g., may be along, abutting, and/or in contact with) a top surface of the second insulative layer 516. Thus, in some implementations, the second insulative layer 516 is between the first insulative layer 512 and the separation structure 518.

The separation structure 518 may be an electrical insulator and may comprise, consist of, or consist essentially of insulative material. The insulative material may comprise, consist of, or consist essentially of silicon dioxide and/or silicon nitride, among other examples. In some implementations, the separation structure 518 may be a different material than the insulator 145.

As shown in FIGS. 5B and 5C, the lattice structure 510 may abut or be in contact with a cell plate 150. For example, a top surface of the lattice structure 510 may interface with (e.g., may be along, abutting, and/or in contact with) a bottom surface of a cell plate 150. For example, the top surface of the lattice structure 510 may be substantially horizontally aligned with a bottom surface of a cell plate 150 (and/or the horizontal surface 506 and/or any other surfaces described herein as being substantially horizontally aligned with the horizontal surface 506). As further shown, in some implementations, the lattice structure 510 does not contact any bottom electrodes 135. Furthermore, in some implementations, the lattice structure 510 does not contact any leaker devices 155. In some implementations, a bottom surface of the lattice structure 510 may be horizontally aligned with or vertically above the top surface of leaker devices 155. This may help ensure that the leaker device 155 or a portion of the leaker device 155 is not removed during a removal process (e.g., an etching process) used to fabricate the structure 500, and therefore helps prevent variation in electrical properties of different leaker devices 155 included in the structure The lattice structure 510 may support the bottom electrodes 135, the leaker devices 155, and/or the pillars 502 during a fabrication process.

The lattice structure 510 may be an electrical insulator and may comprise, consist of, or consist essentially of insulative material. The insulative material may comprise, consist of, or consist essentially of silicon dioxide, silicon nitride, and/or doped versions of silicon dioxide and/or silicon nitride (e.g., doped with carbon), among other examples. In some implementations, the lattice structure 510 may be a nitride. In some implementations, the lattice structure 510 may be a different material than the separation structure 518 and/or the insulator 145.

The first insulative layer 512 may be an electrical insulator and may comprise, consist of, or consist essentially of silicon dioxide and/or silicon nitride, among other examples. In some implementations, the first insulative layer 512 may be a different material than the insulator 145. In some implementations, the first insulative layer 512 may be a different material than the second insulative layer 516. In some implementations, the first insulative layer 512 may be a same material as the second insulative layer 516.

The second insulative layer 516 may separate the insulator 145 from first insulative layer 512 and/or the conductive contacts 514. The second insulative layer 516 may be an electrical insulator and may comprise, consist of, or consist essentially of silicon dioxide and/or silicon nitride, among other examples. In some implementations, the second insulative layer 516 may be a different material than the insulator 145.

A conductive contact 514 may electrically couple a corresponding bottom electrode 135 to a corresponding transistor (not shown, but which may be beneath the structure 500), which may selectively couple that bottom electrode 135 to a digit line 120. As shown, the top surface of a conductive contact 514 may interface with (e.g., may be along, may abut, and/or may be in contact with) the bottom surface of a bottom electrode 135. In some implementations, the conductive contact 514 is a cylinder (within reasonable tolerances of manufacturing and measurement), as described elsewhere herein in connection with the support pillar 504. The conductive contact 514 may be an electrical conductor and may comprise, consist of, or consist essentially of conductive material. The conductive material may comprise, consist of, or consist essentially of a metal (e.g., titanium, tungsten, cobalt, nickel, platinum, and/or ruthenium), a metal composition (e.g., a metal silicide, a metal carbide, and/or a metal nitride, such as titanium nitride or titanium silicon nitride), and/or a conductively-doped semiconductor material (e.g., conductively-doped silicon, conductively-doped germanium, and/or conductively-doped gallium arsenide), among other examples.

In some implementations, the width of the pillar 502 (e.g., a combined width of the support pillar 504 and the bottom electrode 135 and/or a width of the leaker device 155) along they-axis and the illustrated cross-section of FIG. 5B, and/or a diameter of the pillar 502, may be less than or equal to approximately 14 nanometers, or may be in a range from approximately 14 nanometers to approximately 20 nanometers. In some implementations, a pitch of the structure 500 along the y-axis may be less than or equal to approximately 38 nanometers. For example, a distance from a left edge of a pillar 502 or a bottom electrode 135 to a left edge of a neighboring pillar 502 or a neighboring bottom electrode 135 (e.g., that shares a top electrode 140 with the pillar 502 or the bottom electrode 135) may be approximately 26 nanometers (or less than 26 nanometers). In some implementations, a height of the lattice structure 510 may be greater than 100 nanometers, less than 300 nanometers, and/or approximately equal to 200 nanometers. In some implementations, a height of the structure 500 may be greater than 500 nanometers, less than 1000 nanometers, and/or approximately equal to 700 nanometers.

The above dimensions are provided as examples, and the described parts of the structure may have different dimensions in some implementations. For example, some widths and diameters are described above in connection with a pitch of 38 nanometers. Respective widths and diameters may be scaled up or scaled down for different sized pitches, such as 48 nanometers, 43 nanometers, 41 nanometers, or 32 nanometers, among other examples.

The structure 500 may extend along the illustrated y-direction. For example, the structure 500 may include multiple pillars 502 (e.g., tens, dozens, or the like) along the illustrated y-direction before another separation structure 518 is present. A pair of consecutive separation structures 518 may contain (between them) tens, dozens, or more of pillars 502 and/or memory cells 100 along the illustrated cross-section of FIG. 5B.

The structure 500 may be part of an integrated assembly, such as a memory array, a portion of a memory array, or a memory device that includes the memory array. For example, a memory device may include multiple memory cells 100 (e.g., an array of memory cells 100). A memory cell 100 may include a capacitor 110 and a transistor 105. The capacitor 110 may include a bottom electrode 135, a top electrode 140 (e.g., including the first top electrode portions 522 and/or the second top electrode portion 524), and an insulator 145. In some implementations, the top electrode 140 is shared among multiple capacitors 110 corresponding to multiple memory cells 100 (e.g., in a bounded region, described elsewhere herein). The transistor 105 (not shown in FIGS. 5A-5C) may be coupled to the bottom electrode 135 (e.g., via a conductive contact 514) to enable access to the capacitor 110 (e.g., the bottom electrode 135 of the capacitor) via a digit line 120, as described above in connection with FIG. 1. The memory cell 100 and/or the capacitor 110 may also include a leaker device 155. The leaker device 155 may couple the bottom electrode 135 and a cell plate 150 (e.g., via a first top electrode portion 522 coupled with the leaker device 155 and the cell plate 150) that is included in the memory device. All of the leaker devices 155 (e.g., across the structure 500, included in different capacitors 110, and/or included in different memory cells 100) may have substantially identical electrical properties to provide more reliable performance of the memory device, as described elsewhere herein. The memory device may include an array with a large quantity of structures 500 and/or memory cells 100 (e.g., hundreds, thousands, millions, or more) that are substantially identical to one another. The structures 500 and/or memory cells 100 may extend across the memory array along the illustrated x-axis and the illustrated y-axis to form a grid pattern or an array pattern. The memory device may include multiple cell plates 150. Each cell plate 150 may contact a different plurality of leaker devices 155, corresponding to a plurality of memory cells 100, and may contact a different top electrode 140 shared by those memory cells 100.

The structure 500 may further include the transistor 105 of FIG. 1, the access line 115 of FIG. 1, and the digit line 120 of FIG. 1. For example, the bottom electrodes 135 may be coupled to corresponding transistors 105 by respective conductive contacts 514. Thus, the structure may operate as described above in connection with FIG. 1 and/or FIG. 2 to discharge excess charge from bottom electrodes 135.

Each of the illustrated x-axis, y-axis, and z-axis is substantially perpendicular to the other two axes. In other words, the x-axis is substantially perpendicular to the y-axis and the z-axis, the y-axis is substantially perpendicular to the x-axis and the z-axis, and the z-axis is substantially perpendicular to the x-axis and the y-axis. In some cases, a single reference number is shown to refer to a surface, or fewer than all instances of a part may be labeled with all surfaces of that part. All instances of the part may include associated surfaces of that part despite not every surface being labeled.

As indicated above, FIGS. 5A-5C are provided as examples. Other examples may differ from what is described with respect to FIGS. 5A-5C.

Figure 6A:
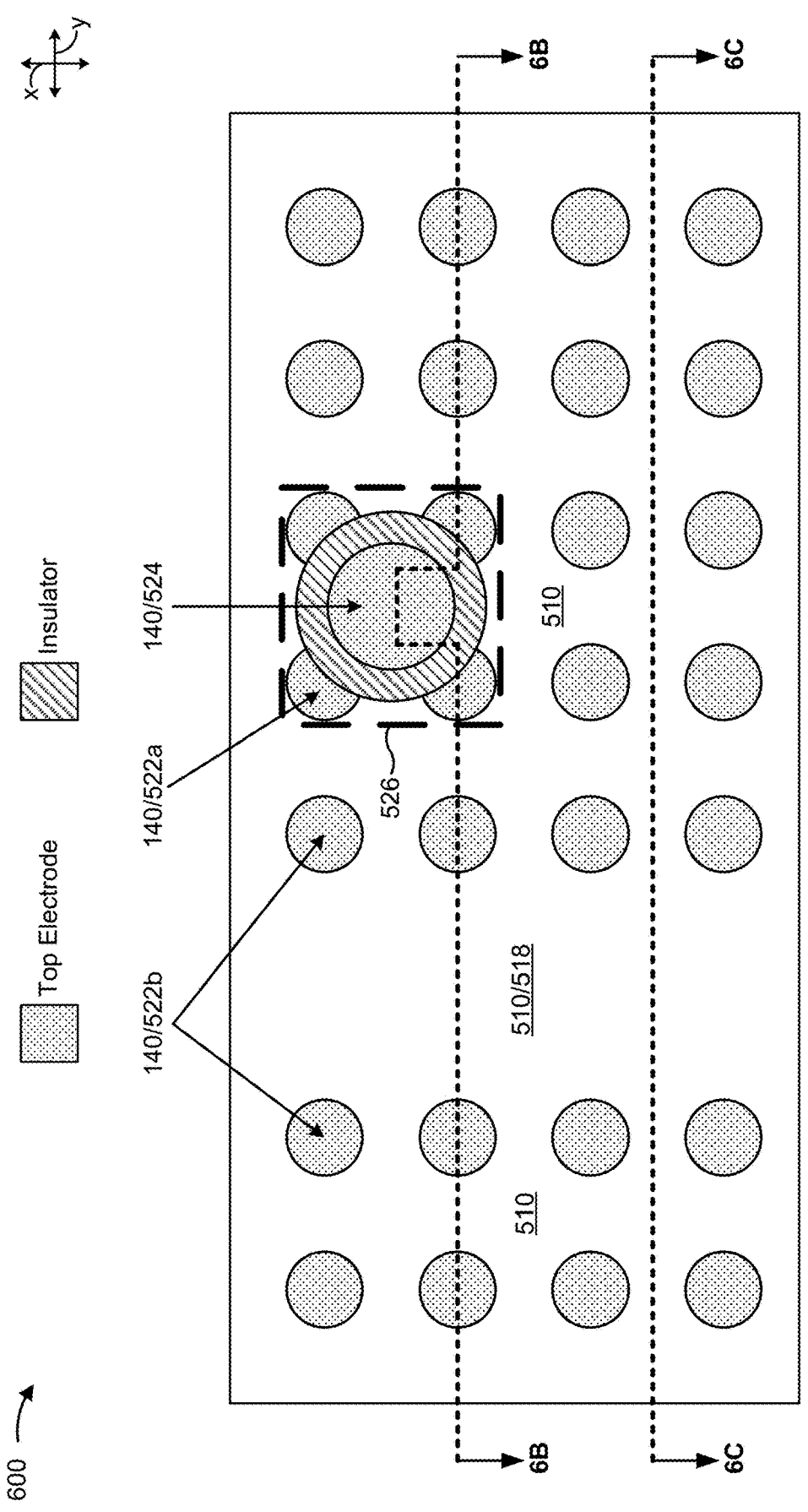
FIGS. 6A-6C are diagrammatic views of another example structure described herein.
Figure 6B:
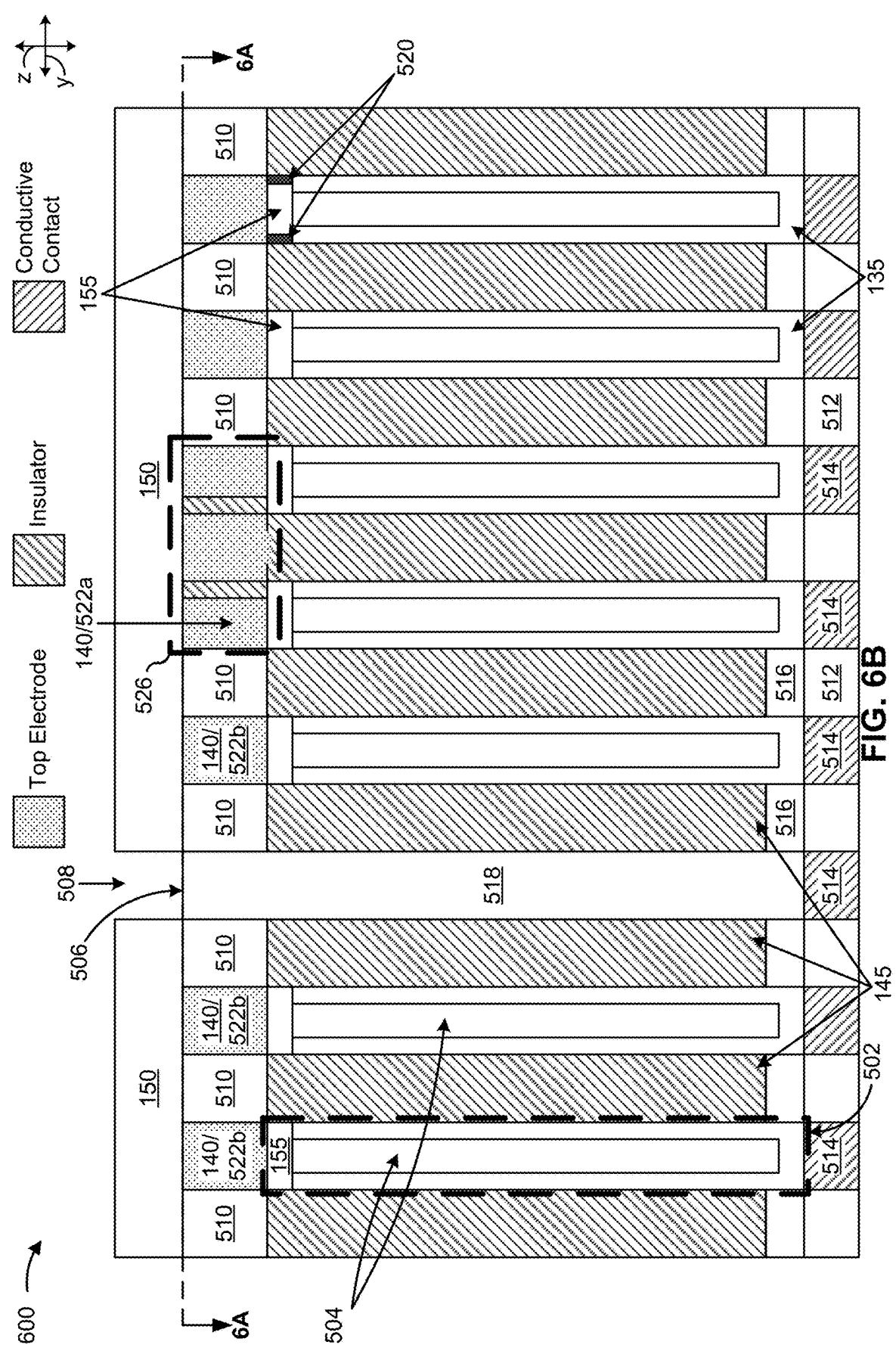
Figure 6C:
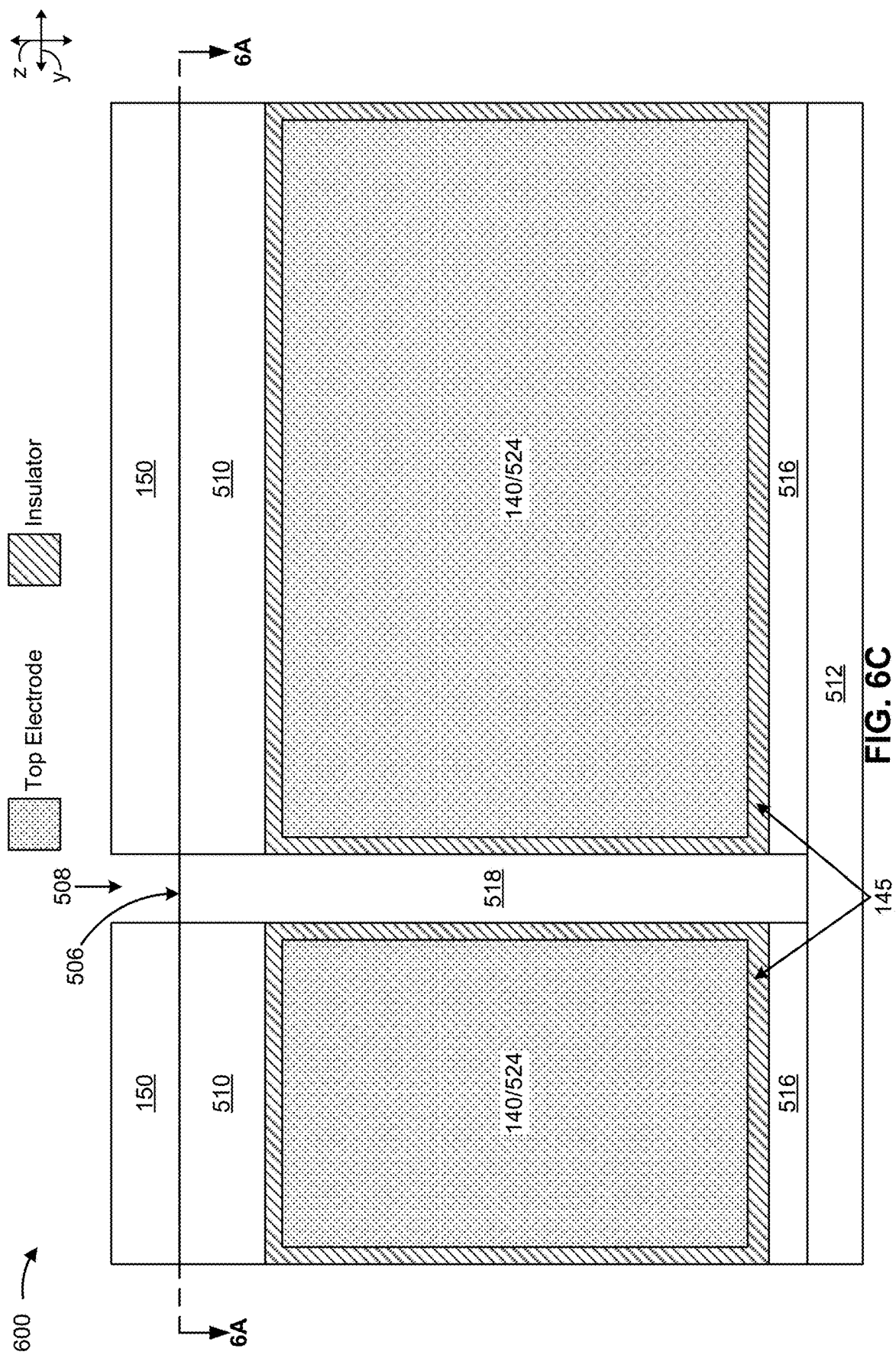

FIGS. 6A-6C are diagrammatic views of an example structure 600. The structure 600 may be part of an integrated assembly, such as a memory array, a portion of a memory array, or a memory device that includes the memory array and one or more other components (e.g., sense amplifiers, a row decoder, a column decoder, a row address buffer, a column address buffer, one or more data buffers, one or more clocks, one or more counters, and/or a memory controller).

The structure 600 is the same as the structure 500, except that the second top electrode portion 524 is not present in the cross-sectional view of the structure 600 shown in FIG. 6B.

In the structure 600, there may be less material of the top electrode 140 interacting with each individual bottom electrode 135 (e.g., in a capacitor 110) as compared to the structure 500. In the structure 500, the second top electrode portion 524 wraps around a portion of the insulator 145 that is wrapped around a bottom electrode 135, which is not the case in the structure 600. Instead, the second top electrode portion 524 in the structure 600 is present only along cross sections between rows of bottom electrodes 135, such as the cross-section shown in FIG. 6C. This may enable a smaller pitch of the structure 600 along the y-axis as compared to a pitch of the structure 500. In other words, a distance between adjacent or neighboring bottom electrodes along the y-axis may be smaller in the structure 600 than in the structure 500.

As indicated above, FIGS. 6A-6C are provided as examples. Other examples may differ from what is described with respect to FIGS. 6A-6C.

FIG. 7 is a flowchart of an example method 700 of forming an integrated assembly or memory device with a leaker device. In some implementations, one or more process blocks of FIG. 7 may be performed by various semiconductor manufacturing equipment.

As shown in FIG. 7, the method 700 may include forming a lattice structure (block 710). As further shown in FIG. 7, the method 700 may include forming a plurality of bottom electrodes supported by the lattice structure (block 720). As further shown in FIG. 7, the method 700 may include forming a plurality of leaker devices, wherein each leaker device, of the plurality of leaker devices, is situated on top of a corresponding bottom electrode of the plurality of bottom electrodes (block 730). As further shown in FIG. 7, the method 700 may include forming a plurality of first top electrode portions of a top electrode, wherein each first top electrode portion, of the plurality of first top electrode portions, is situated on top of a corresponding leaker device of the plurality of leaker devices (block 740). As further shown in FIG. 7, the method 700 may include forming an insulator in contact with the plurality of bottom electrodes and in contact with the plurality of leaker devices (block 750). As further shown in FIG. 7, the method 700 may include forming a second top electrode portion that is separated from the plurality of bottom electrodes by the insulator (block 760). As further shown in FIG. 7, the method 700 may include forming a cell plate, wherein each leaker device, of the plurality of leaker devices, couples a corresponding bottom electrode to the cell plate via a corresponding first top electrode portion and is configured to discharge excess charge from that bottom electrode to the cell plate (block 770).

The method 700 may include additional implementations, such as any single implementation or any combination of implementations described below and/or in connection with one or more other methods described elsewhere herein.

In some implementations, each leaker device, of the plurality of leaker devices, is formed such that a respective top surface of each leaker device is either below a bottom surface of the lattice structure or is substantially horizontally aligned with the bottom surface of the lattice structure. In some implementations, a respective top surface of each leaker device, of the plurality of leaker devices, is substantially flat.

Although FIG. 7 shows example blocks of the method 700, in some implementations, the method 700 may include additional blocks, fewer blocks, different blocks, or differently arranged blocks than those depicted in FIG. 7. In some implementations, the method 700 may include forming the structure 500 or the structure 600, an integrated assembly that includes the structure 500 or the structure 600, any part described herein of the structure 500 or the structure 600, and/or any part described herein of an integrated assembly that includes the structure 500 or the structure 600. For example, the method 700 may include forming one or more of the parts 105-160 and/or 502-526.

FIGS. 8A-8B through 21A-21B are diagrammatic views showing formation of the structure 500 at example process stages of an example process of forming the structure 500. In some implementations, the example process described below in connection with FIGS. 8A-8B through 21A-21B may correspond to the method 700 and/or one or more blocks of the method 700. However, the process described below is an example, and other example processes may be used to form the structure 500, an integrated assembly that includes the structure 500, and/or one or more parts of the structure 500 and/or the integrated assembly. The structure 600 may be formed in a similar manner.

Figure 8B:

As shown in FIGS. 8A-8B, the process may include forming (e.g., depositing or growing) insulative material 802 on a base structure (not shown, but which may be beneath the insulative material 802). The insulative material 802 may form the first insulative layer 512 and may comprise, consist of, or consist essentially of one or more of the materials described above in connection with the first insulative layer 512. The base structure may include, for example, transistors 105, access lines 115, and/or digit lines 120.

As shown in FIGS. 8A-8B, the process may include forming (e.g., depositing or growing) electrically conductive material 804 on the base structure. The electrically conductive material 804 may form the conductive contacts 514 and may comprise, consist of, or consist essentially of one or more of the materials described above in connection with the conductive contacts 514.

As shown in FIGS. 8A-8B, the process may include forming (e.g., depositing or growing) insulative material 806 on the insulative material 802 and the electrically conductive material 804. The insulative material 806 may form the second insulative layer 516 and may comprise, consist of, or consist essentially of one or more of the materials described above in connection with the second insulative layer 516.

As shown in FIGS. 8A-8B, the process may include forming (e.g., depositing or growing) insulative material 808 on the insulative material 806. The insulative material 808 may comprise, consist of, or consist essentially of an oxide (e.g., silicon dioxide) or tetraethoxysilane (TEOS, also known as tetraethyl orthosilicate), among other examples.

As shown in FIGS. 8A-8B, the process may include forming (e.g., depositing or growing) insulative material 810 on the insulative material 808. The insulative material 810 may form the lattice structure 510, and may comprise, consist of, or consist essentially of one or more of the materials described above in connection with the lattice structure 510.

Figure 9B:

As shown in FIGS. 9A-9B, the process may include removing (e.g., etching) material to form voids 902. The removed material may include insulative material 806, insulative material 808, and insulative material 810. Thus, the removal may be a full stack removal (e.g., a full stack etch) to remove all material in the voids 902 except for the electrically conductive material 804. As shown, a shape of the voids 902 may be a cylinder. A mask may be used to cover a portion of the structure, and material may be removed (e.g., etched) from unmasked regions to form the voids 902. This step may form pillars of insulative material 806, insulative material 808, and insulative material 810 along the illustrated cross-section of FIG. 9B. Each of these pillars may have substantially the same dimensions.

Figure 10A:
FIGS. 10A and 10B are diagrammatic views showing formation of the structure of FIGS. 5A-5C at an example process stage that is after the example process stage of FIGS. 9A and 9B.
Figure 10B:
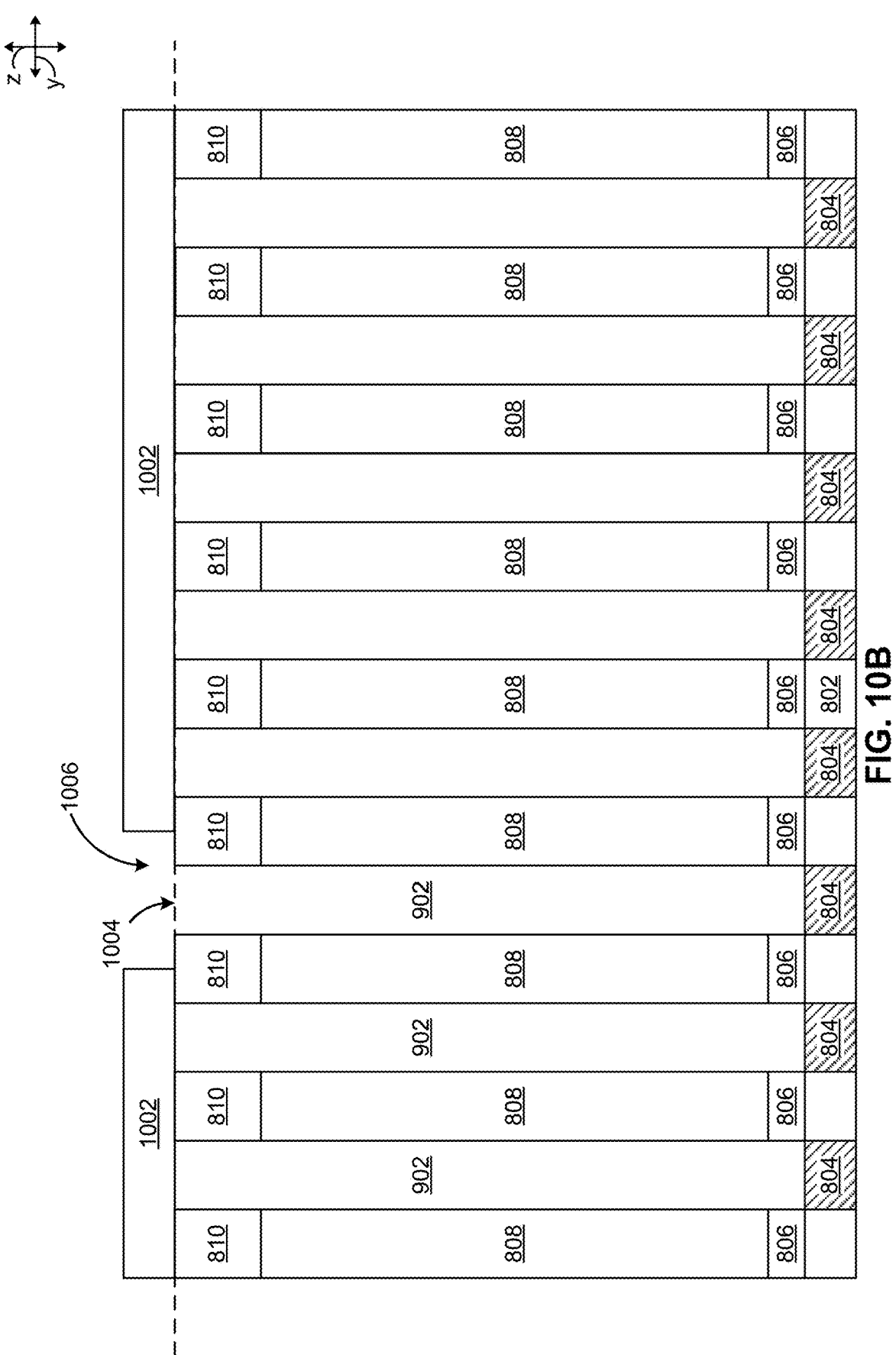

As shown in FIGS. 10A-10B, the process may include forming (e.g., depositing or growing) a mask 1002 along a horizontal surface 1004 that is substantially horizontally aligned with the top surfaces of the insulative material 810 (e.g., the top surfaces of pillars with the insulative material 810 on top). The mask 1002 may comprise, consist of, or consist essentially of carbon (or another hard mask), among other examples. In some implementations, the mask 1002 may be applied using a spin-on carbon technique. As further shown, the process may include removing (e.g., etching) material from the mask 1002 to form an unmasked trench region 1006. In some implementations, the width of the unmasked trench region 1006 (e.g., along the y-axis) may be approximately equal to the pitch of the structure 500.

Figure 11B:

As shown in FIGS. 11A-11B, the process may include filling (e.g., depositing or growing within) voids 902, that are unmasked as a result of forming the unmasked trench region 1006, with insulative material 1102. As shown, masked voids (e.g., that are masked by the mask 1002) are not filled with the insulative material 1102. The insulative material 1102 may form the separation structure 518 and may comprise, consist of, or consist essentially of one or more of the materials described above in connection with the separation structure 518. As shown, the insulative material 1102 may be deposited on the electrically conductive material 804 in a void 902 between pillars, may fill the unmasked trench region 1006 between the mask 1002, and may be deposited on the mask 1002.

Figure 12B:
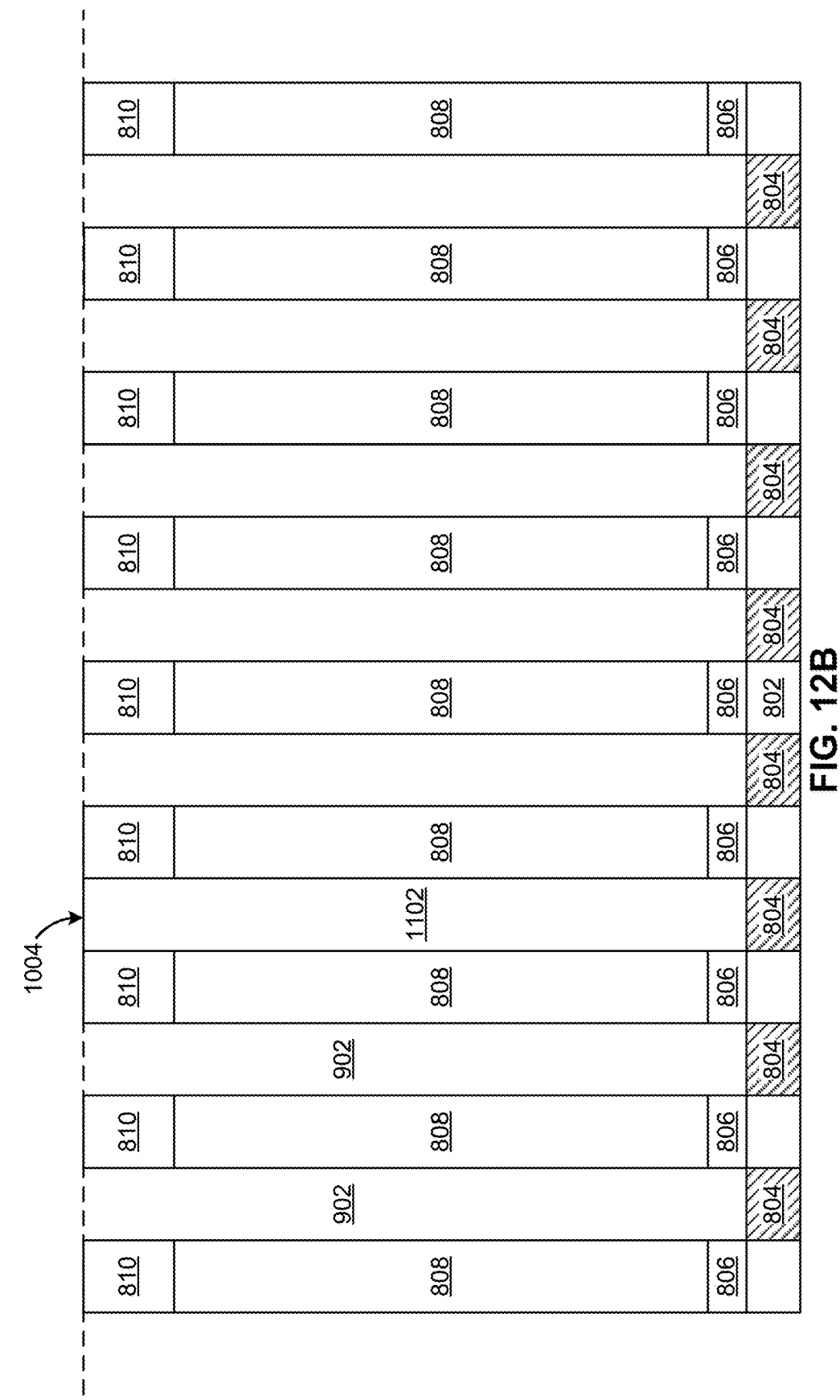

As shown in FIGS. 12A-12B, the process may include removing (e.g., etching) the mask 1002 (e.g., an entirety of the mask 1002) and removing (e.g., etching) a portion of the insulative material 1102 down to the horizontal surface 1004. In some implementations, the process may include planarizing the horizontal surface 1004 of the integrated assembly. For example, the horizontal surface 1004 may be planarized using chemical-mechanical polishing or another suitable planarization technique.

Figure 13B:

As shown in FIGS. 13A-13B, the process may include forming (e.g., depositing or growing) electrically conductive material 1302 on the electrically conductive material 804, the insulative material 806, the insulative material 808, the insulative material 810, and the insulative material 1102. For example, the electrically conductive material 1302 may be formed in the remaining (unmasked) voids 902 along surfaces of materials that are exposed to those voids 902. The electrically conductive material 1302 may be formed such that a void 1304 is formed in a region contained by a shape of the electrically conductive material 1302. The electrically conductive material 1302 may form the bottom electrodes 135 and may comprise, consist of, or consist essentially of one or more of the materials described above in connection with the bottom electrode 135.

As shown in FIGS. 13A-13B, the process may include forming (e.g., depositing or growing) material 1306 on the electrically conductive material 1302. For example, the material 1306 may be formed in the voids 1304. The material 1306 may form support pillars 504 and may comprise, consist of, or consist essentially of one or more of the materials described above in connection with the support pillar 504.

Figure 14A:
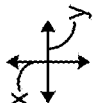
FIGS. 14A and 14B are diagrammatic views showing formation of the structure of FIGS. 5A-5C at an example process stage that is after the example process stage of FIGS. 13A and 13B.
Figure 14B:
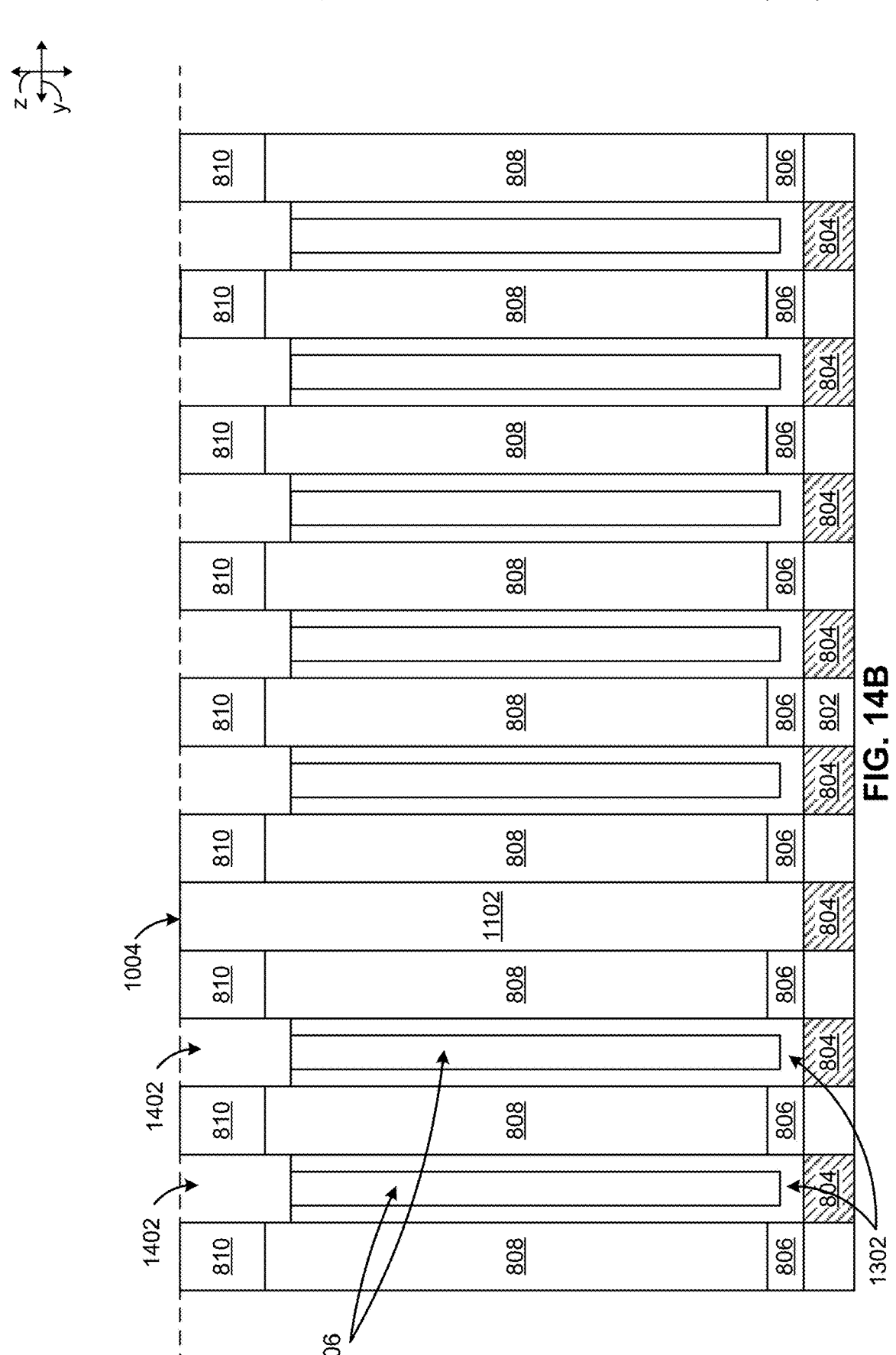

As shown in FIGS. 14A-14B, the process may include removing (e.g., etching) a portion of the electrically conductive material 1302 and a portion of the material 1306 to form recessed regions 1402. In some implementations, the depth of the recessed regions along the z-axis (e.g., measured down from the horizontal surface 1004) may be greater than a height of the insulative material 810. For example, the recessed regions 1402 may be recessed to a location that is lower than the insulative material 810 and that exposes a portion of the insulative material 808. In some implementations, the process may include planarizing the horizontal surface 1004 (e.g., using chemical-mechanical polishing or another suitable planarization technique) and removing (e.g., etching) electrically conductive material 1302 and material 1306 between pillars of insulative material.

Figure 15A:
FIGS. 15A and 15B are diagrammatic views showing formation of the structure of FIGS. 5A-5C at an example process stage that is after the example process stage of FIGS. 14A and 14B.
Figure 15B:
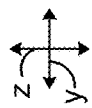

As shown in FIGS. 15A-15B, the process may include forming (e.g., depositing or growing) electrically conductive material 1502 on the electrically conductive material 1302 and the material 1306. The electrically conductive material 1502 may be in contact with the insulative material 808. In some implementations, the electrically conductive material 1502 is not in contact with the insulative material 810. For example, the electrically conductive material 1502 may be formed in the recessed regions 1402. The electrically conductive material 1502 may form the leaker devices 155 and may comprise, consist of, or consist essentially of one or more of the materials described above in connection with the leaker device 155. In some implementations, the electrically conductive material 1502 may be grown such that a top surface of the electrically conductive material 1502 is lower than or is substantially horizontally aligned with a bottom surface of the insulative material 810. In some implementations, the electrically conductive material 1502 may be formed in the recessed regions 1402 (e.g., to fill all or a portion of the recessed regions 1402), and a portion of the electrically conductive material 1502 may be removed (e.g., etched) such that a top surface of the electrically conductive material 1502 is lower than or is substantially horizontally aligned with a bottom surface of the insulative material 810. This may help ensure that the leaker device 155 or a portion of the leaker device 155 is not removed during a removal process (e.g., described below in connection with FIGS. 17A-17B) and therefore helps prevent variation in electrical properties and physical dimensions of different leaker devices 155.

In some implementations, prior to forming the electrically conductive material 1502, the process may include forming a leaker liner 520, as described elsewhere herein. For example, the leaker liner 520 may be formed (e.g., deposited or grown) on the electrically conductive material 1302 and the material 1306. The leaker liner 520 may be in contact with the insulative material 808. In some implementations, the leaker liner 520 is not in contact with the insulative material 810. For example, the leaker liner 520 may be formed in the recessed regions 1402. In some implementations, a portion of the leaker liner 520 in contact with the electrically conductive material 1302 may be removed (e.g., resulting in the leaker liner structure shown in FIG. 5B and described above), and the electrically conductive material 1502 (e.g., the leaker device 155) may be formed to be in contact with the electrically conductive material 1502. For example, a portion of the leaker liner 520 may be removed using directional etching. Vertical surfaces of the electrically conductive material 1502 may be in contact with the leaker liner 520 and protected from a subsequent removal process, such as the exhume process described below in connection with FIGS. 18A-18B.

Figure 16A:
FIGS. 16A and 16B are diagrammatic views showing formation of the structure of FIGS. 5A-5C at an example process stage that is after the example process stage of FIGS. 15A and 15B.
Figure 16B:
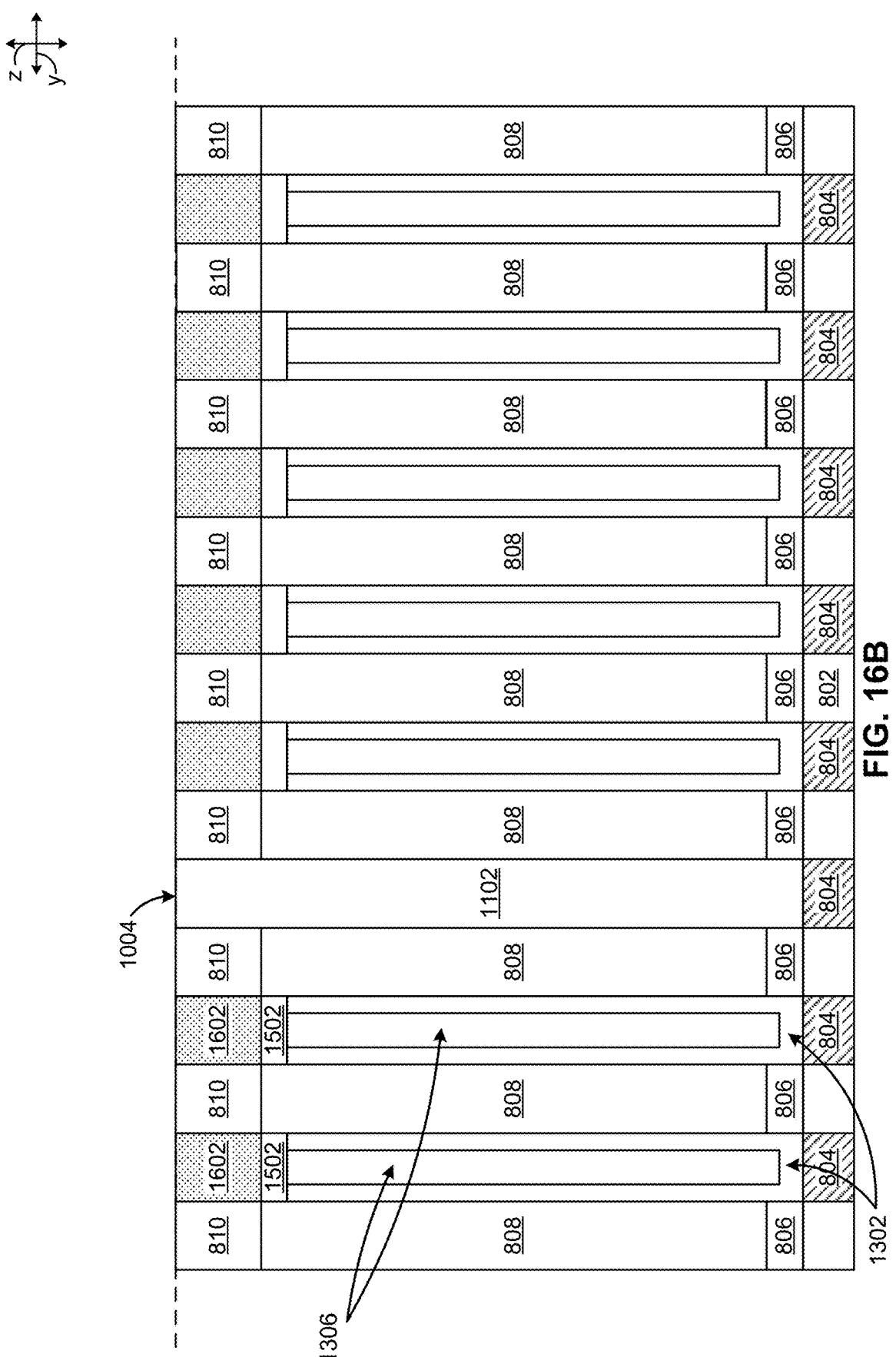

As shown in FIGS. 16A-16B, the process may include forming (e.g., depositing or growing) electrically conductive material 1602 on the electrically conductive material 1502. The electrically conductive material 1602 may be in contact with the insulative material 810. The electrically conductive material 1602 may fill the recessed regions 1402. The electrically conductive material 1602 may form the first top electrode portion 522 and may comprise, consist of, or consist essentially of one or more of the materials described above in connection with the top electrode 140.

Figure 17A:
FIGS. 17A and 17B are diagrammatic views showing formation of the structure of FIGS. 5A-5C at an example process stage that is after the example process stage of FIGS. 16A and 16B.
Figure 17B:
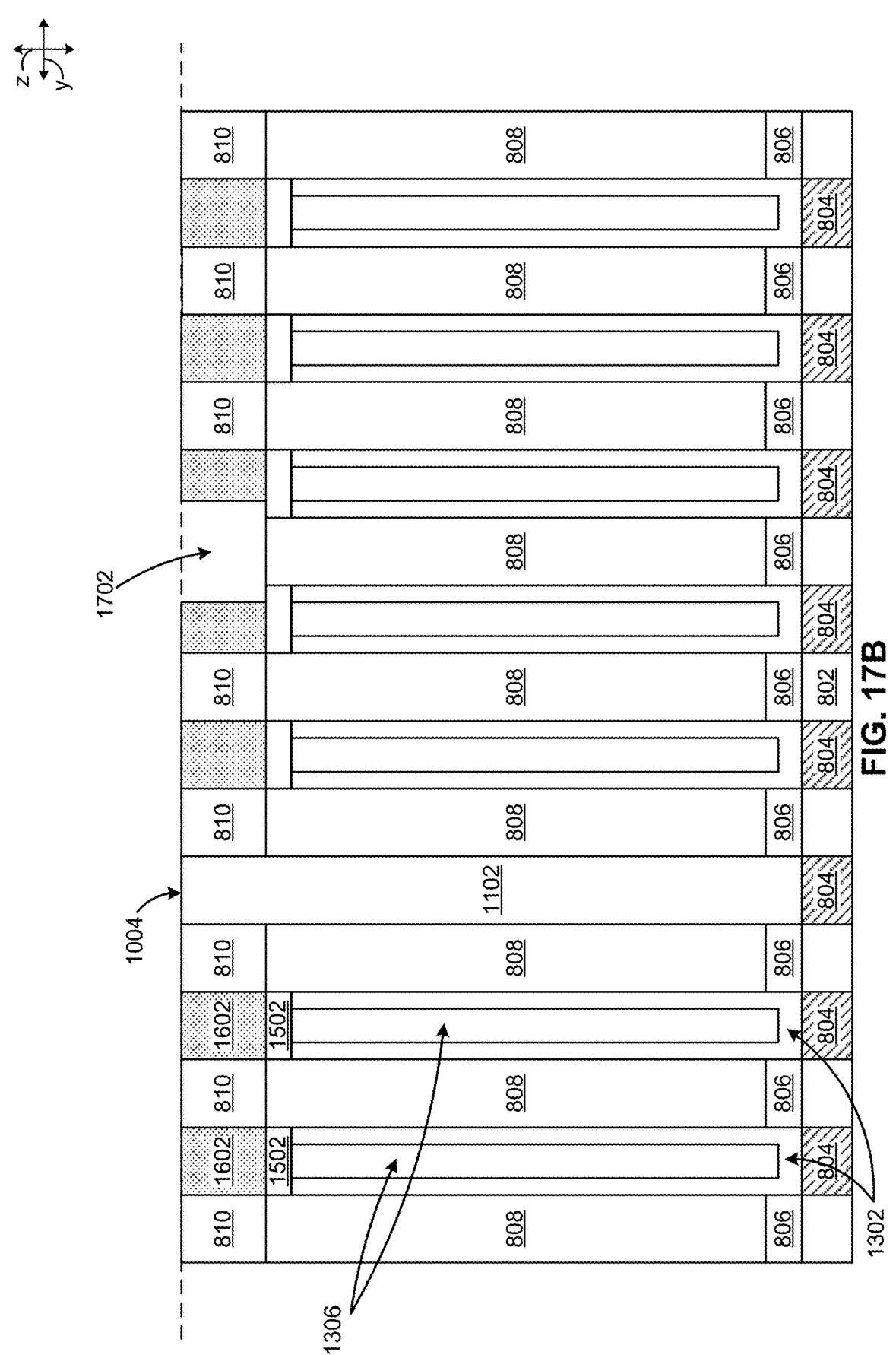

As shown in FIGS. 17A-17B, the process may include removing (e.g., etching) a portion of the insulative material 810 and the electrically conductive material 1602 to form an opening 1702. The opening 1702 may expose the insulative material 808 (e.g., may remove insulative material 810 from a top surface of the insulative material 810 to the insulative material 808) and/or may expose a portion of one or more leaker devices 155 (e.g., the electrically conductive material 1502). As shown, the removed insulative material 810 may be removed down to a bottom surface of that insulative material 810, and because an entirety of the leaker device 155 (e.g., the electrically conductive material 1502) is below the insulative material 810, the leaker device 155 may be entirely preserved (e.g., no part of the leaker device 155 is removed). This may help prevent variation in electrical properties and physical dimensions of different leaker devices 155 included in the structure.

Figure 18B:
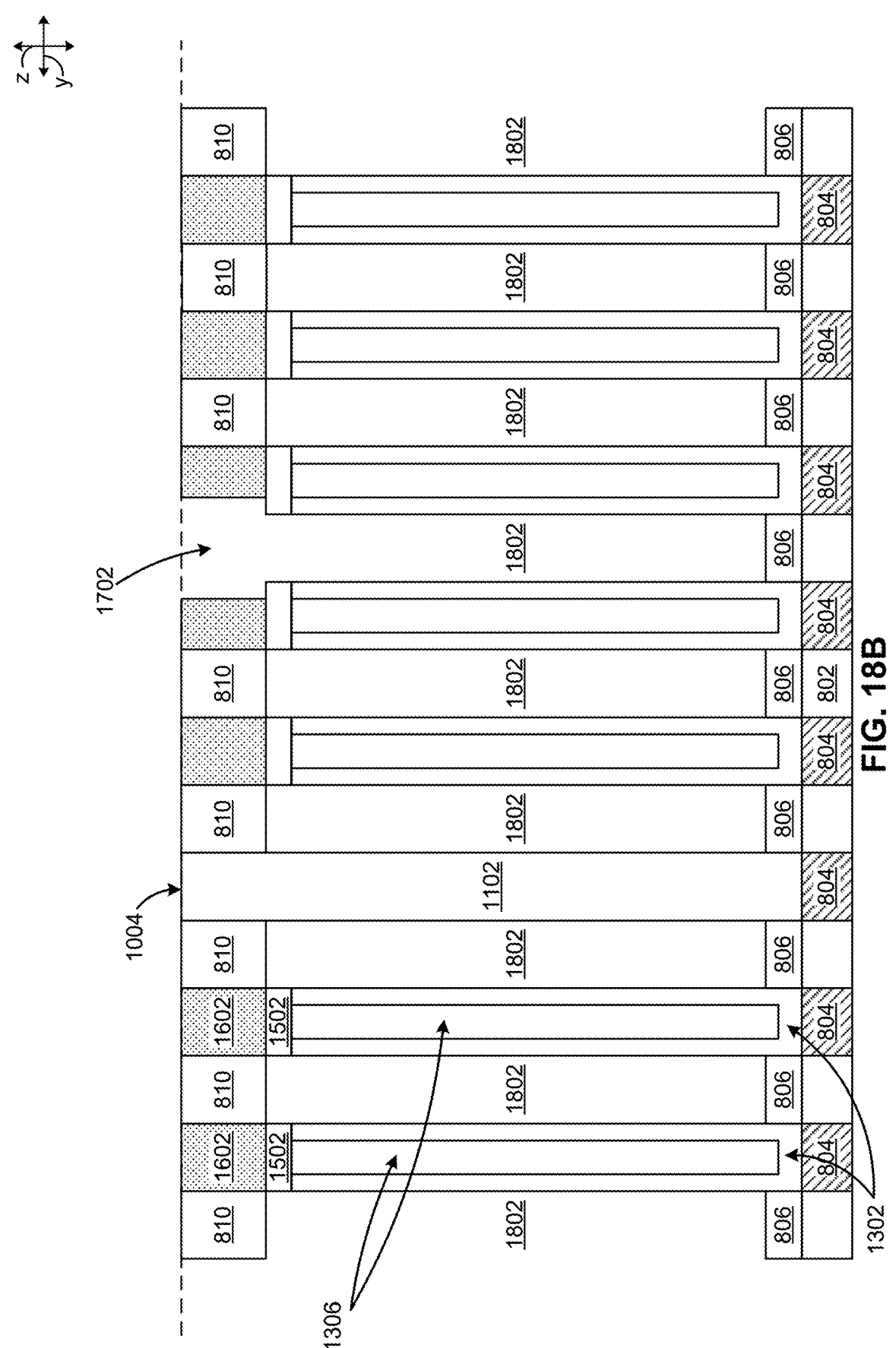

As shown in FIGS. 18A-18B, the process may include removing (e.g., etching) material to form voids 1802. The removed material may include the insulative material 808. For example, the insulative material 808 may be exhumed, such as by using a wet etching process that selectively removes the insulative material 808 (e.g., an oxide or TEOS) without removing material (or without removing a significant amount of the material) of the bottom electrode 135 (e.g., the electrically conductive material 1302), the leaker device 155 (e.g., the electrically conductive material 1502), the separation structure 518 (e.g., the insulative material 1102, which may be a nitride), and/or the second insulative layer 516 (e.g., the insulative material 806, which may be a nitride).

Figure 19B:
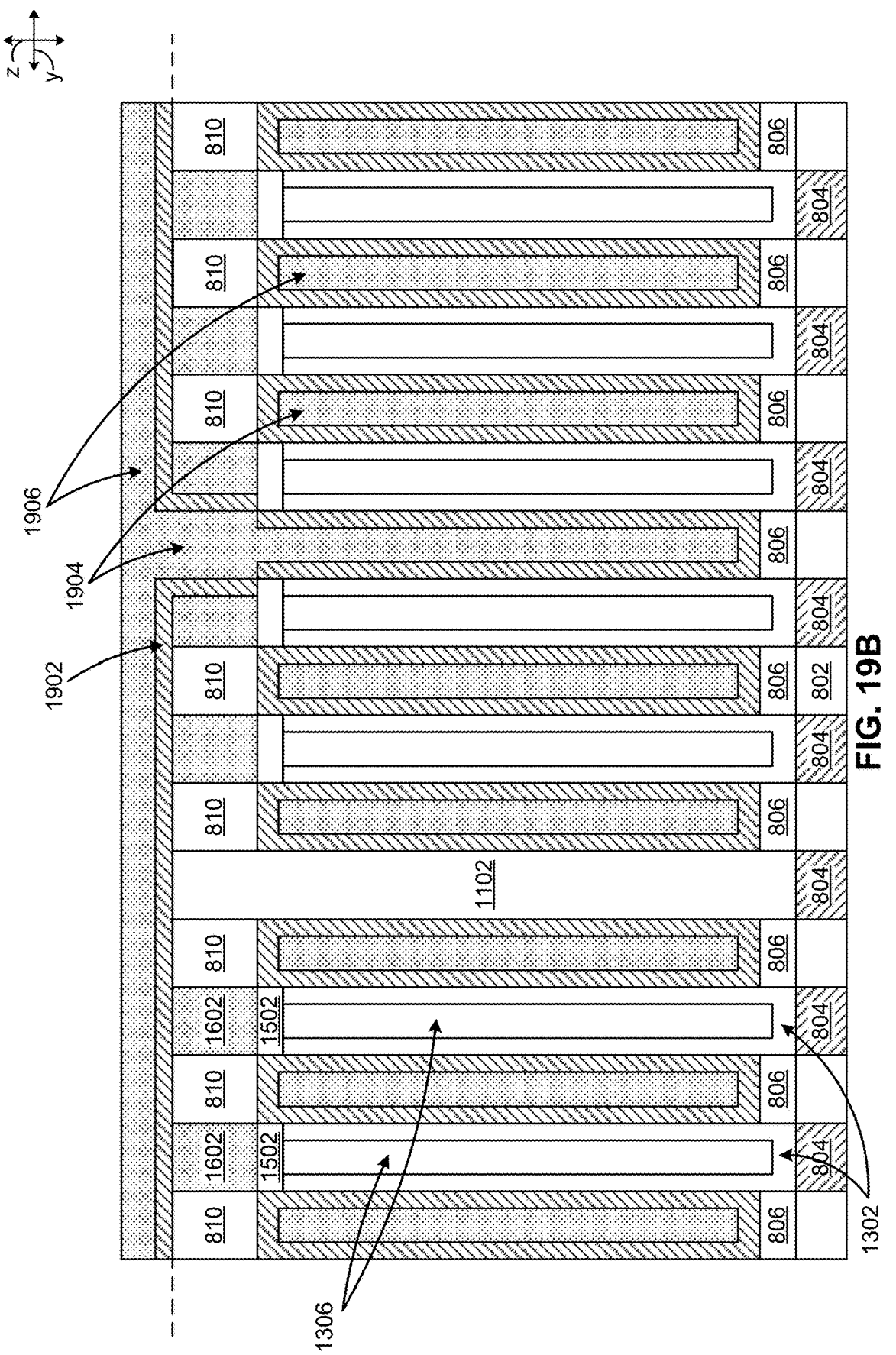

As shown in FIGS. 19A-19B, the process may include forming (e.g., depositing or growing) insulative material 1902 on the insulative material 806, the electrically conductive material 1302, the electrically conductive material 1502, the insulative material 810, the electrically conductive material 1602, and the insulative material 1102. For example, the insulative material 1902 may be formed in the voids 1802 along surfaces of materials that are exposed to the voids 1802. The insulative material 1902 may be formed such that voids 1904 are formed in regions contained by a shape of the insulative material 1902. The insulative material 1902 may form the insulator 145 and may comprise, consist of, or consist essentially of one or more of the materials described above in connection with the insulator 145. In some implementations, to form the structure 600, the insulative material 1902 may fill an entirety of the voids 1802 in the cross-section illustrated in FIG. 19B (and as shown and described above in connection with FIG. 6B).

As shown in FIGS. 19A-19B, the process may include forming (e.g., depositing or growing) electrically conductive material 1906 on the insulative material 1902. For example, the electrically conductive material 1906 may be formed in the voids 1904. In some implementations, the electrically conductive material 1906 may fill the voids 1904. The electrically conductive material 1906 may form the second top electrode portion 524 and may comprise, consist of, or consist essentially of one or more of the materials described above in connection with the top electrode 140. In some implementations, to form the structure 600, the electrically conductive material 1906 may fill regions of the structure where other material (e.g., the insulative material 1902) is not present (e.g., in the cross-section illustrated in FIG. 6C, described above).

Figure 20A:
FIGS. 20A and 20B are diagrammatic views showing formation of the structure of FIGS. 5A-5C at an example process stage that is after the example process stage of FIGS. 19A and 19B.
Figure 20B:
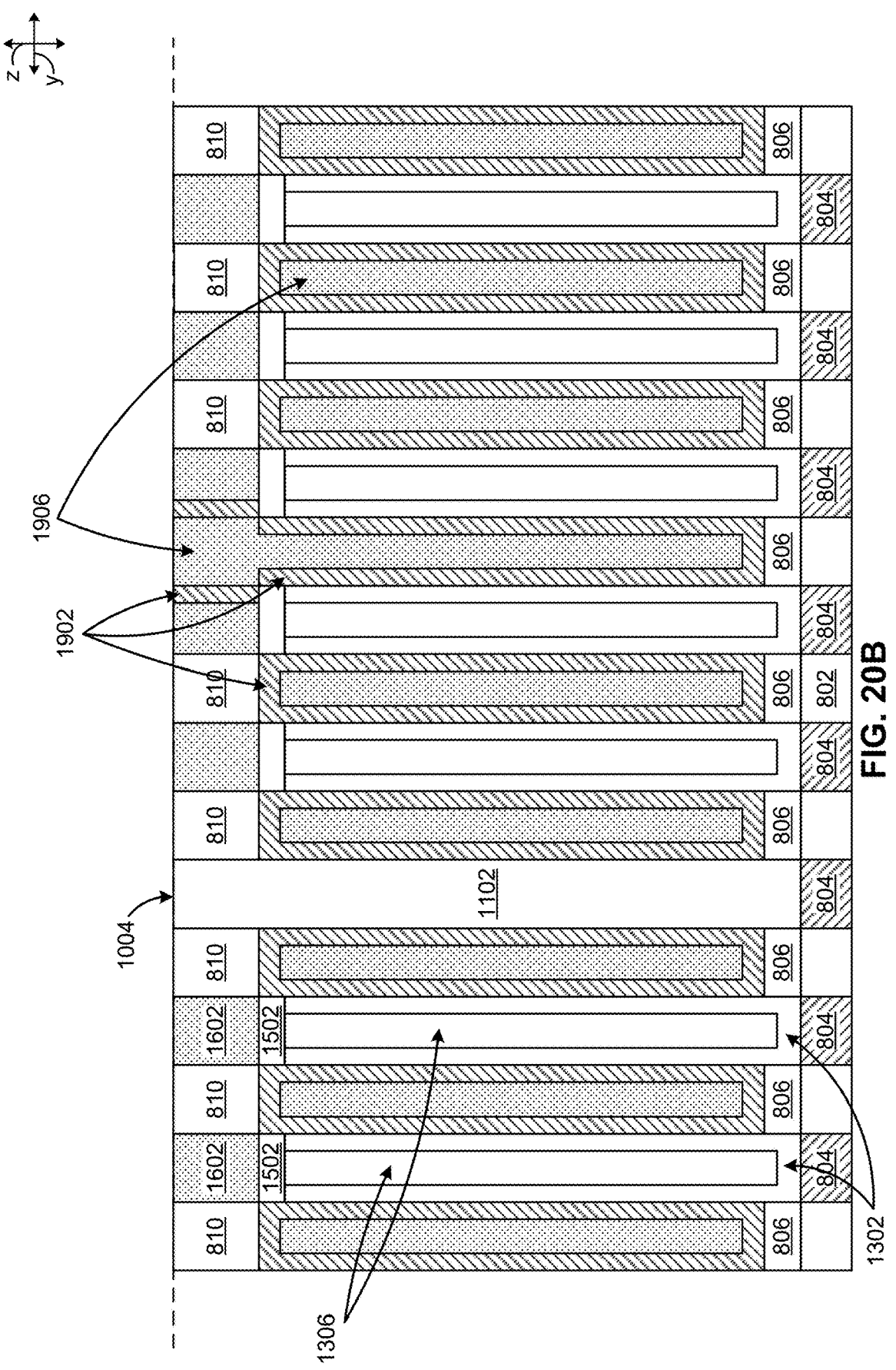

As shown in FIGS. 20A-20B, the process may include removing (e.g., etching) a portion of the insulative material 1902 and/or removing (e.g., etching) a portion of the electrically conductive material 1906 down to the horizontal surface 1004. In some implementations, the process may include planarizing the horizontal surface 1004 of the integrated assembly. For example, the horizontal surface 1004 may be planarized using chemical-mechanical polishing or another suitable planarization technique.

Figure 21A:
FIGS. 21A and 21B are diagrammatic views showing formation of the structure of FIGS. 5A-5C at an example process stage that is after the example process stage of FIGS. 20A and 20B.
Figure 21B:
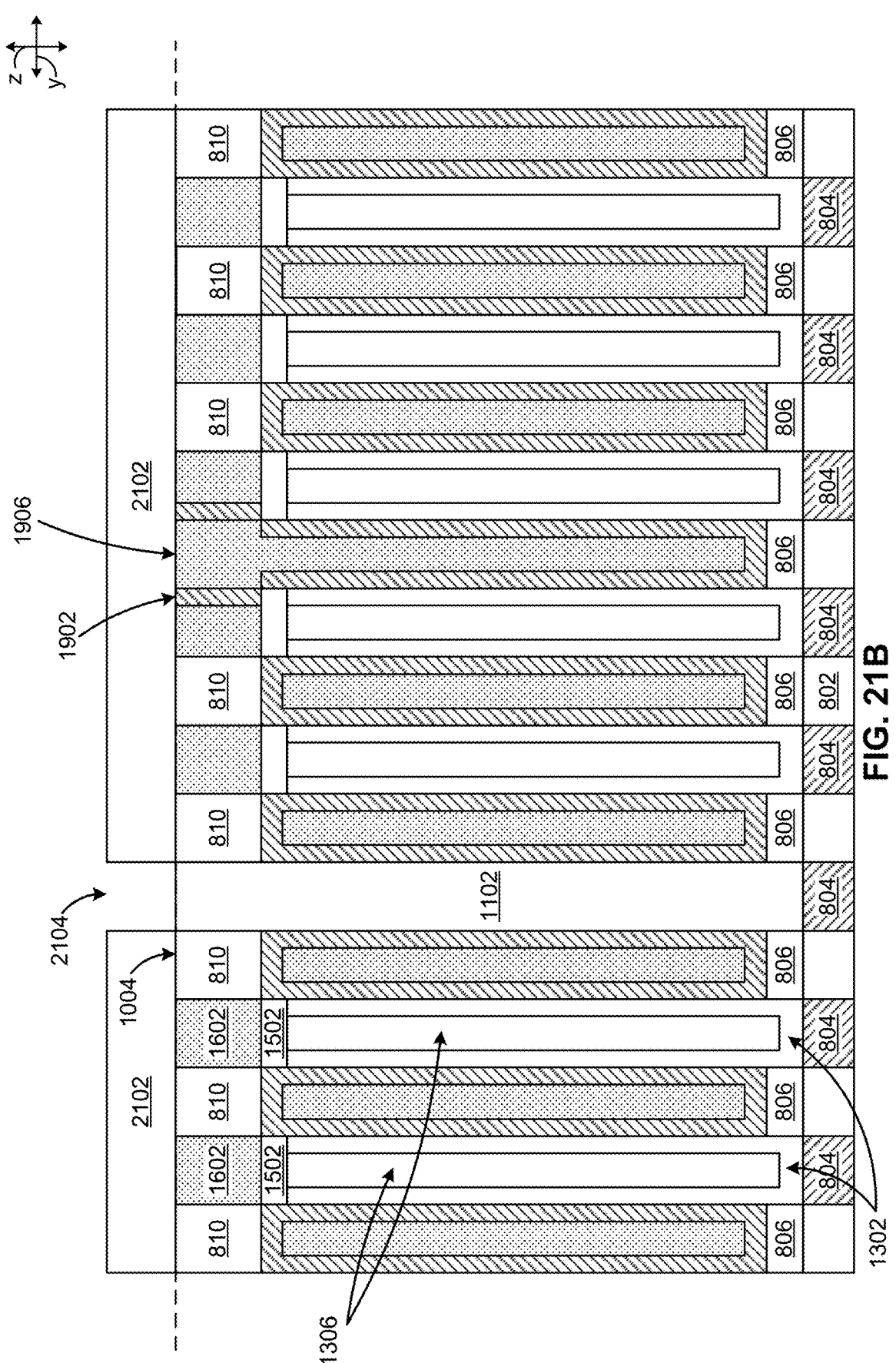

As shown in FIGS. 21A-21B, the process may include forming (e.g., depositing or growing) electrically conductive material 2102 on the insulative material 810, the electrically conductive material 1602, the insulative material 1902, the electrically conductive material 1906, and the insulative material 1102. The electrically conductive material 2102 may form the cell plates 150 and may comprise, consist of, or consist essentially of one or more of the materials described above in connection with the cell plate 150.

As shown in FIGS. 21A-21B, the process may include removing (e.g., etching) a portion of the electrically conductive material 2102 to form a gap 2104. The gap 2104 may remove all of the electrically conductive material 2102, along a trench, down to the insulative material 810 and/or the insulative material 1102 (e.g., down to the horizontal surface 1004).

As indicated above, the process steps described in connection with FIGS. 8A-8B through 21A-21B are provided as examples. Other examples may differ from what is described with respect to FIGS. 8A-8B through 21A-21B. The structure shown in FIGS. 21A-21B may be equivalent to the structure 500 described elsewhere herein. In process steps above that describe forming material, such material may be formed, for example, using chemical vapor deposition, atomic layer deposition, physical vapor deposition, or another deposition technique. In process steps above that describe removing material, such material may be removed, for example, using a wet etching technique (e.g., wet chemical etching), a dry etching technique (e.g., plasma etching), an ion etching technique (e.g., sputtering or reactive ion etching), atomic layer etching, or another etching technique.

Figure 22:
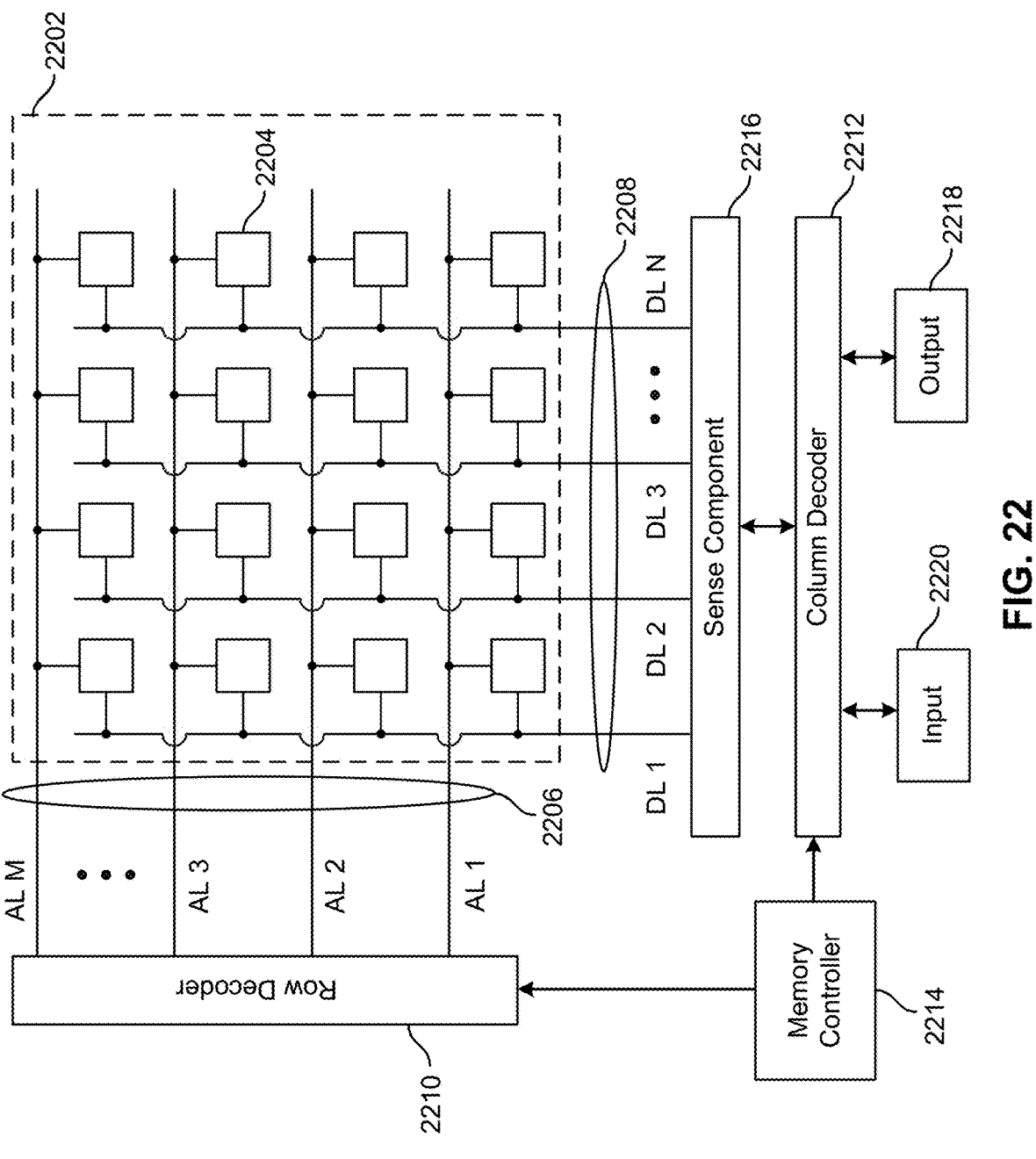
FIG. 22 is a diagrammatic view of an example memory device.

FIG. 22 is a diagrammatic view of an example memory device 2200. The memory device 2200 may include a memory array 2202 that includes multiple memory cells 2204. A memory cell 2204 is programmable or configurable into a data state of multiple data states (e.g., two or more data states). For example, a memory cell 2204 may be set to a particular data state at a particular time, and the memory cell 2204 may be set to another data state at another time. A data state may correspond to a value stored by the memory cell 2204. The value may be a binary value, such as a binary 0 or a binary 1, or may be a fractional value, such as 0.5, 1.5, or the like. A memory cell 2204 may include a capacitor to store a charge representative of the data state. For example, a charged and an uncharged capacitor may represent a first data state and a second data state, respectively. As another example, a first level of charge (e.g., fully charged) may represent a first data state, a second level of charge (e.g., fully discharged) may represent a second data state, a third level of charge (e.g., partially charged) may represent a third data state, and so son.

Operations such as reading and writing (i.e., cycling) may be performed on memory cells 2204 by activating or selecting the appropriate access line 2206 (shown as access lines AL 1 through AL M) and digit line 2208 (shown as digit lines DL 1 through DL N). An access line 2206 may also be referred to as a "row line" or a "word line," and a digit line 2208 may also be referred to a "column line" or a "bit line." Activating or selecting an access line 2206 or a digit line 2208 may include applying a voltage to the respective line. An access line 2206 and/or a digit line 2208 may comprise, consist of, or consist essentially of a conductive material, such as a metal (e.g., copper, aluminum, gold, titanium, or tungsten) and/or a metal alloy, among other examples. In FIG. 22, each row of memory cells 2204 is connected to a single access line 2206, and each column of memory cells 2204 is connected to a single digit line 2208. By activating one access line 2206 and one digit line 2208 (e.g., applying a voltage to the access line 2206 and digit line 2208), a single memory cell 2204 may be accessed at (e.g., is accessible via) the intersection of the access line 2206 and the digit line 2208. The intersection of the access line 2206 and the digit line 2208 may be called an "address" of a memory cell 2204.

In some implementations, the logic storing device of a memory cell 2204, such as a capacitor, may be electrically isolated from a corresponding digit line 2208 by a selection component, such as a transistor. The access line 2206 may be connected to and may control the selection component. For example, the selection component may be a transistor, and the access line 2206 may be connected to the gate of the transistor. Activating the access line 2206 results in an electrical connection or closed circuit between the capacitor of a memory cell 2204 and a corresponding digit line 2208. The digit line 2208 may then be accessed (e.g., is accessible) to either read from or write to the memory cell 2204.

A row decoder 2210 and a column decoder 2212 may control access to memory cells 2204. For example, the row decoder 2210 may receive a row address from a memory controller 2214 and may activate the appropriate access line 2206 based on the received row address. Similarly, the column decoder 2212 may receive a column address from the memory controller 2214 and may activate the appropriate digit line 2208 based on the column address.

Upon accessing a memory cell 2204, the memory cell 2204 may be read (e.g., sensed) by a sense component 2216 to determine the stored data state of the memory cell 2204. For example, after accessing the memory cell 2204, the capacitor of the memory cell 2204 may discharge onto its corresponding digit line 2208. Discharging the capacitor may be based on biasing, or applying a voltage, to the capacitor. The discharging may induce a change in the voltage of the digit line 2208, which the sense component 2216 may compare to a reference voltage (not shown) to determine the stored data state of the memory cell 2204. For example, if the digit line 2208 has a higher voltage than the reference voltage, then the sense component 2216 may determine that the stored data state of the memory cell 2204 corresponds to a first value, such as a binary 1. Conversely, if the digit line 2208 has a lower voltage than the reference voltage, then the sense component 2216 may determine that the stored data state of the memory cell 2204 corresponds to a second value, such as a binary 0. The detected data state of the memory cell 2204 may then be output (e.g., via column decoder 2212) to an output component 2218 (e.g., a data buffer). A memory cell 2204 may be written (e.g., set) by activating the appropriate access line 2206 and digit line 2208. The column decoder 2212 may receive data, such as input from input component 2220, to be written to one or more memory cells 2204. A memory cell 2204 may be written by applying a voltage across the capacitor of the memory cell 2204.

The memory controller 2214 may control the operation (e.g., read, write, re-write, refresh, and/or recovery) of the memory cells 2204 via the row decoder 2210, the column decoder 2212, and/or the sense component 2216. The memory controller 2214 may generate row address signals and column address signals to activate the desired access line 2206 and digit line 2208. The memory controller 2214 may also generate and control various voltages used during the operation of the memory array 2202.

In some implementations, the memory device 2200 includes the structure 500 and/or the structure 600. Additionally, or alternatively, the memory device 2200 may include an integrated assembly that includes the structure 500 and/or the structure 600. For example, the memory array 2202 may include the structure 500 and/or the structure 600. Additionally, or alternatively, the memory array 2202 may include an integrated assembly that includes the structure 500 and/or the structure 600. Additionally, or alternatively, the memory cell 2204 may include a memory cell described elsewhere herein.

As indicated above, FIG. 22 is provided as an example. Other examples may differ from what is described with respect to FIG. 22.

In some implementations, an integrated assembly includes a cell plate; a pillar that includes a bottom electrode and a leaker device on top of the bottom electrode; and a top electrode that includes: a first top electrode portion that is separated from the bottom electrode by the leaker device, wherein the leaker device is configured to discharge excess charge from the bottom electrode to the cell plate via the first top electrode portion; and a second top electrode portion that is separated from the bottom electrode and the leaker device by an insulator.

In some implementations, an integrated assembly includes a cell plate; a lattice structure in contact with the cell plate; a top electrode in contact with the cell plate; and a pillar that includes a bottom electrode and a leaker device on top of the bottom electrode, wherein a top surface of the leaker device is either lower than a bottom surface of the lattice structure or is substantially horizontally aligned with the bottom surface of the lattice structure, and wherein the leaker device is configured to discharge excess charge from the bottom electrode to the cell plate.

In some implementations, a memory device includes a cell plate; and a memory cell that includes: a transistor; a bottom electrode electrically coupled with the transistor; a leaker device on top of the bottom electrode; and a top electrode shared among a plurality of memory cells, wherein a portion of the top electrode is on top of the leaker device, is under the cell plate, and is in contact with both the leaker device and the cell plate, wherein the leaker device is configured to discharge excess charge from the bottom electrode to the cell plate via the portion of the top electrode.

In some implementations, a method includes forming a lattice structure; forming a plurality of bottom electrodes supported by the lattice structure, forming a plurality of leaker devices, wherein each leaker device, of the plurality of leaker devices, is situated on top of a corresponding bottom electrode of the plurality of bottom electrodes; forming a plurality of first top electrode portions of a top electrode, wherein each first top electrode portion, of the plurality of first top electrode portions, is situated on top of a corresponding leaker device of the plurality of leaker devices; forming an insulator in contact with the plurality of bottom electrodes and in contact with the plurality of leaker devices; forming a second top electrode portion that is separated from the plurality of bottom electrodes by the insulator; and forming a cell plate, wherein each leaker device, of the plurality of leaker devices, couples a corresponding bottom electrode to the cell plate via a corresponding first top electrode portion and is configured to discharge excess charge from that bottom electrode to the cell plate.

The foregoing disclosure provides illustration and description but is not intended to be exhaustive or to limit the implementations to the precise forms disclosed. Modifications and variations may be made in light of the above disclosure or may be acquired from practice of the implementations described herein.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated degrees or at other orientations), and the spatially relative descriptors used herein may be interpreted accordingly. Furthermore, the cross-sectional views in the figures only show features within the planes of the cross-sections and do not show materials behind those planes, unless indicated otherwise, to simplify the figures.

As used herein, the terms "substantially" and "approximately" mean "within reasonable tolerances of manufacturing and measurement." As used herein, "satisfying a threshold" may, depending on the context, refer to a value being greater than the threshold, greater than or equal to the threshold, less than the threshold, less than or equal to the threshold, equal to the threshold, not equal to the threshold, or the like. All ranges described herein are inclusive of numbers at the ends of those ranges, unless specifically indicated otherwise.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. An integrated assembly, comprising:
a cell plate;
a pillar that includes a bottom electrode and a leaker device on top of the bottom electrode; and
a top electrode that includes:
a first top electrode portion that is separated from the bottom electrode by the leaker device, wherein the leaker device is configured to discharge excess charge from the bottom electrode to the cell plate via the first top electrode portion; and
a second top electrode portion that is separated from the bottom electrode and the leaker device by an insulator, wherein the insulator is between the first top electrode portion and the second top electrode portion.

2. The integrated assembly of claim 1, further comprising a lattice structure in contact with the cell plate, wherein a top surface of the leaker device is lower than a bottom surface of the lattice structure.

3. The integrated assembly of claim 1, further comprising a lattice structure in contact with the cell plate, wherein a top surface of the leaker device is substantially horizontally aligned with a bottom surface of the lattice structure.

4. The integrated assembly of claim 1, wherein the leaker device comprises, consists of, or consists essentially of aluminum oxide, amorphous silicon, silicon nitride, titanium oxynitride, niobium oxynitride, titanium silicon nitride, nickel oxy nitride, or conductively-doped germanium.

5. The integrated assembly of claim 1, wherein the leaker device has a height in a range from approximately 10 angstroms to approximately 100 angstroms.

6. The integrated assembly of claim 1, wherein the top electrode, the bottom electrode, and the insulator form a capacitor.

7. The integrated assembly of claim 6, further comprising a plurality of capacitors that share the top electrode,
wherein each capacitor, of the plurality of capacitors, includes a corresponding leaker device, and wherein all of those leaker devices have substantially identical electrical properties.

8. The integrated assembly of claim 6, further comprising a plurality of capacitors that share the top electrode,
wherein each capacitor, of the plurality of capacitors, includes a corresponding leaker device, and wherein all of those leaker devices have substantially identical physical dimensions.

9. The integrated assembly of claim 1, further comprising a leaker liner around an exterior vertical surface of the leaker device.

10. The integrated assembly of claim 9, wherein the leaker liner comprises, consists of, or consists essentially of a nitride.

11. An integrated assembly, comprising:

a cell plate;

a lattice structure in contact with the cell plate;

a top electrode in contact with the cell plate, wherein the top electrode includes a first top electrode portion in contact with the cell plate and a second top electrode portion in contact with the cell plate;

an insulator in contact with the top electrode and the cell plate, wherein a top surface of the top electrode is substantially horizontally aligned with a top surface of the insulator, and wherein the insulator is between the first top electrode portion and the second top electrode portion; and a pillar that includes a bottom electrode and a leaker device on top of the bottom electrode, wherein a top surface of the leaker device is either lower than a bottom surface of the lattice structure or is substantially horizontally aligned with the bottom surface of the lattice structure, and wherein the leaker device is configured to discharge excess charge from the bottom electrode to the cell plate.

12. The integrated assembly of claim 11, wherein a portion of the top electrode is on top of the leaker device.

13. The integrated assembly of claim 12, wherein the portion of the top electrode is directly in contact with the leaker device and the cell plate.

14. The integrated assembly of claim 11, wherein the top electrode includes:

a first top electrode portion that is separated from the bottom electrode by the leaker device, wherein the leaker device is configured to discharge excess charge from the bottom electrode to the cell plate via the first top electrode portion; and a second top electrode portion that is separated from the bottom electrode and the leaker device by an insulator.

15. The integrated assembly of claim 14, wherein the lattice structure is in contact with the first top electrode portion.

16. The integrated assembly of claim 14, wherein the lattice structure is not in contact with the second top electrode portion.

17. The integrated assembly of claim 11, wherein the top electrode and the bottom electrode are parts of a capacitor, and wherein the integrated assembly further comprises a plurality of capacitors that share the top electrode.

18. A memory device, comprising:

a cell plate; and a memory cell that includes:

a transistor;

a bottom electrode electrically coupled with the transistor;

a leaker device on top of the bottom electrode;

a top electrode shared among a plurality of memory cells, wherein a portion of the top electrode is on top of the leaker device, is under the cell plate, and is in contact with both the leaker device and the cell plate, wherein the leaker device is configured to discharge excess charge from the bottom electrode to the cell plate via the portion of the top electrode; and an insulator in contact with the top electrode, wherein a top surface of the top electrode is substantially horizontally aligned with a top surface of the insulator, and wherein the insulator is between the portion of the top electrode and a second portion of the top electrode and wherein the cell plate is in contact with the top surface of the top electrode and the top surface of the insulator.

19. The memory device of claim 18, further comprising a lattice structure in contact with the cell plate, wherein a top surface of the leaker device is either lower than a bottom surface of the lattice structure or is substantially horizontally aligned with the bottom surface of the lattice structure.

20. The memory device of claim 18, wherein the leaker device comprises, consists of, or consists essentially of silicon, a nitride, an oxynitride, an oxide, or a conductively-doped semiconductor material.

21. The memory device of claim 18, wherein the leaker device has a height that is greater than or equal to approximately 10 angstroms.

22. The memory device of claim 18, wherein the leaker device has a height that is less than or equal to approximately 100 angstroms.

23. A method, comprising:

forming a lattice structure;

forming a plurality of bottom electrodes supported by the lattice structure, forming a plurality of leaker devices, wherein each leaker device, of the plurality of leaker devices, is situated on top of a corresponding bottom electrode of the plurality of bottom electrodes;

forming a plurality of first top electrode portions of a top electrode, wherein each first top electrode portion, of the plurality of first top electrode portions, is situated on top of a corresponding leaker device of the plurality of leaker devices;

forming an insulator in contact with the plurality of bottom electrodes and in contact with the plurality of leaker devices;

forming a second top electrode portion that is separated from the plurality of bottom electrodes by the insulator, wherein the insulator is between the first top electrode portion and the second top electrode portion; and forming a cell plate, wherein each leaker device, of the plurality of leaker devices, couples a corresponding bottom electrode to the cell plate via a corresponding first top electrode portion and is configured to discharge excess charge from that bottom electrode to the cell plate.

24. The method of claim 23, wherein each leaker device, of the plurality of leaker devices, is formed such that a respective top surface of each leaker device is either below a bottom surface of the lattice structure or is substantially horizontally aligned with the bottom surface of the lattice structure.

25. The method of claim 23, wherein a respective top surface of each leaker device, of the plurality of leaker devices, is substantially flat.

* * * * *